(12) United States Patent
Hilliard et al.

(10) Patent No.: US 8,731,875 B2
(45) Date of Patent: *May 20, 2014

(54) SYSTEM AND METHOD FOR PROVIDING DATA CORRESPONDING TO PHYSICAL OBJECTS

(75) Inventors: Lucas J. Hilliard, Oslo (NO); Jose J. Sequeira, Jr., The Woodlands, TX (US); Kelly G. Walker, Sugar Land, TX (US); Marek K. Czernuszenko, Sugar Land, TX (US); Neal L. Adair, Sugar Land, TX (US); Timothy A. Chartrand, Spring, TX (US); Alan R. Wild, Humble, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 102 days.

This patent is subject to a terminal disclaimer.

(21) Appl. No.: 13/152,015

(22) Filed: Jun. 2, 2011

(65) Prior Publication Data

US 2012/0037379 A1 Feb. 16, 2012

Related U.S. Application Data

(60) Provisional application No. 61/373,334, filed on Aug. 13, 2010.

(51) Int. Cl.
*G06F 17/50* (2006.01)
*G06F 7/60* (2006.01)
*E21B 49/00* (2006.01)
*G01V 11/00* (2006.01)

(52) U.S. Cl.
CPC ............... *E21B 49/00* (2013.01); *G01V 11/00* (2013.01); *G06F 17/50* (2013.01)
USPC .................................................. 703/1; 703/2

(58) Field of Classification Search
USPC ...................................... 703/1–2, 6; 364/512
See application file for complete search history.

(56) References Cited

U.S. PATENT DOCUMENTS

| 5,740,342 A | 4/1998 | Kocberber |
| 5,905,657 A | 5/1999 | Celniker |

(Continued)

FOREIGN PATENT DOCUMENTS

| CA | 2312381 | 6/1999 |
| EP | 1036341 | 2/2005 |

(Continued)

OTHER PUBLICATIONS

Castanie, L. et al. (2003), "3D Display of Properties for Unstructured Grids," 23$^{rd}$ Gocad Meeting, 18 pgs.

(Continued)

*Primary Examiner* — Matt Kim
*Assistant Examiner* — Maryam Ipakchi
(74) *Attorney, Agent, or Firm* — ExxonMobil Upstream Research Company, Law Dept.

(57) ABSTRACT

There is provided a system and method for providing a visualization of data describing a physical structure. An exemplary method comprises defining an unstructured grid that corresponds to a three-dimensional physical structure, the unstructured grid comprising data representative of a property of interest. The exemplary method also comprises defining a probe as an object that comprises a set of topological elements, at least one of which does not share a common plane. The exemplary method additionally comprises providing a visualization of the unstructured grid data on the geometry defined by the probe.

28 Claims, 19 Drawing Sheets

(56) References Cited

U.S. PATENT DOCUMENTS

| | | | |
|---|---|---|---|
| 6,018,497 A | 1/2000 | Gunasekera | |
| 6,035,255 A | 3/2000 | Murphy | |
| 6,044,328 A | 3/2000 | Murphy | |
| 6,070,125 A | 5/2000 | Murphy | |
| 6,106,561 A * | 8/2000 | Farmer | 703/10 |
| 6,236,994 B1 | 5/2001 | Swartz et al. | |
| 6,278,949 B1 | 8/2001 | Alam | |
| 6,373,489 B1 | 4/2002 | Lu et al. | |
| 6,519,568 B1 | 2/2003 | Harvey et al. | |
| 6,549,879 B1 | 4/2003 | Cullick et al. | |
| 6,765,570 B1 | 7/2004 | Cheung et al. | |
| 6,772,066 B2 | 8/2004 | Cook | |
| 6,826,483 B1 | 11/2004 | Anderson et al. | |
| 6,829,570 B1 | 12/2004 | Thambynayagam et al. | |
| 6,907,392 B2 | 6/2005 | Bennis et al. | |
| 6,912,468 B2 | 6/2005 | Marin et al. | |
| 6,980,935 B2 | 12/2005 | Lu et al. | |
| 7,003,439 B2 | 2/2006 | Aldred et al. | |
| 7,027,925 B2 | 4/2006 | Terentyev et al. | |
| 7,031,842 B1 | 4/2006 | Musat et al. | |
| 7,047,165 B2 * | 5/2006 | Balaven et al. | 703/2 |
| 7,047,170 B2 | 5/2006 | Feldman et al. | |
| 7,079,953 B2 | 7/2006 | Thorne et al. | |
| 7,082,387 B1 * | 7/2006 | Wolfe, Jr. | 703/6 |
| 7,098,908 B2 | 8/2006 | Acosta et al. | |
| 7,203,342 B2 | 4/2007 | Pedersen | |
| 7,248,258 B2 | 7/2007 | Acosta et al. | |
| 7,281,213 B2 | 10/2007 | Callegari | |
| 7,337,067 B2 | 2/2008 | Sanstrom | |
| 7,340,347 B2 | 3/2008 | Shray et al. | |
| 7,366,616 B2 | 4/2008 | Bennett et al. | |
| 7,376,539 B2 | 5/2008 | Lecomte | |
| 7,379,386 B2 * | 5/2008 | Muyzert et al. | 367/63 |
| 7,437,358 B2 | 10/2008 | Arrouye et al. | |
| 7,451,066 B2 | 11/2008 | Edwards et al. | |
| 7,460,957 B2 | 12/2008 | Prange et al. | |
| 7,539,625 B2 | 5/2009 | Klumpen et al. | |
| 7,548,873 B2 | 6/2009 | Veeningen | |
| 7,596,481 B2 | 9/2009 | Zamora et al. | |
| 7,603,264 B2 | 10/2009 | Zamora et al. | |
| 7,606,666 B2 | 10/2009 | Repin et al. | |
| 7,616,213 B2 | 11/2009 | Chuter | |
| 7,617,083 B2 | 11/2009 | Bennis et al. | |
| 7,627,430 B2 | 12/2009 | Hawtin | |
| 7,634,395 B2 | 12/2009 | Flandrin et al. | |
| 7,657,414 B2 | 2/2010 | Zamora et al. | |
| 7,657,494 B2 | 2/2010 | Wilkinson et al. | |
| 7,716,029 B2 | 5/2010 | Couet et al. | |
| 7,725,302 B2 | 5/2010 | Ayan et al. | |
| 7,796,468 B2 | 9/2010 | Kellogg | |
| 7,809,537 B2 | 10/2010 | Hemanthkumar et al. | |
| 7,913,190 B2 | 3/2011 | Grimaud et al. | |
| 7,925,483 B2 | 4/2011 | Xia et al. | |
| 7,970,545 B2 | 6/2011 | Sanstrom | |
| 7,991,595 B2 | 8/2011 | Pao et al. | |
| 8,073,663 B2 | 12/2011 | Carruthers et al. | |
| 8,094,515 B2 | 1/2012 | Miller et al. | |
| 8,204,727 B2 | 6/2012 | Dean et al. | |
| 8,305,376 B2 | 11/2012 | Ran et al. | |
| 8,325,179 B2 | 12/2012 | Murray et al. | |
| 8,346,695 B2 | 1/2013 | Pepper et al. | |
| 8,364,404 B2 | 1/2013 | Legendre et al. | |
| 2002/0038201 A1 * | 3/2002 | Balaven et al. | 703/2 |
| 2002/0120429 A1 | 8/2002 | Ortoleva | |
| 2004/0268338 A1 | 12/2004 | Gurpinar et al. | |
| 2005/0015231 A1 | 1/2005 | Edwards et al. | |
| 2005/0165555 A1 | 7/2005 | Jackson | |
| 2005/0259101 A1 | 11/2005 | Westgaard et al. | |
| 2007/0199721 A1 | 8/2007 | Givens et al. | |
| 2007/0213935 A1 | 9/2007 | Fagnou et al. | |
| 2007/0266082 A1 | 11/2007 | McConnell et al. | |
| 2007/0294034 A1 | 12/2007 | Bratton et al. | |
| 2008/0088621 A1 | 4/2008 | Grimaud et al. | |
| 2008/0162093 A1 | 7/2008 | Nivlet et al. | |
| 2008/0165185 A1 | 7/2008 | Smith et al. | |
| 2008/0165186 A1 | 7/2008 | Lin | |
| 2008/0289877 A1 | 11/2008 | Nikolakis-Mouchas et al. | |
| 2008/0297510 A1 | 12/2008 | Callegari | |
| 2008/0306803 A1 | 12/2008 | Vaal et al. | |
| 2009/0027380 A1 | 1/2009 | Rajan et al. | |
| 2009/0027385 A1 | 1/2009 | Smith | |
| 2009/0037114 A1 | 2/2009 | Peng et al. | |
| 2009/0043507 A1 | 2/2009 | Dommisse et al. | |
| 2009/0089028 A1 | 4/2009 | Sagert et al. | |
| 2009/0125362 A1 | 5/2009 | Reid et al. | |
| 2009/0198476 A1 * | 8/2009 | Kim et al. | 703/2 |
| 2009/0222742 A1 | 9/2009 | Pelton et al. | |
| 2009/0229819 A1 | 9/2009 | Repin et al. | |
| 2009/0259446 A1 * | 10/2009 | Zhang et al. | 703/2 |
| 2009/0295792 A1 | 12/2009 | Liu et al. | |
| 2009/0299709 A1 | 12/2009 | Liu | |
| 2009/0303233 A1 * | 12/2009 | Lin et al. | 345/419 |
| 2010/0053161 A1 | 3/2010 | Chuter | |
| 2010/0171740 A1 | 7/2010 | Andersen et al. | |
| 2010/0214870 A1 | 8/2010 | Pepper et al. | |
| 2010/0283788 A1 | 11/2010 | Rothnemer et al. | |
| 2011/0029293 A1 | 2/2011 | Petty et al. | |
| 2011/0054857 A1 * | 3/2011 | Moguchaya | 703/2 |
| 2011/0060572 A1 | 3/2011 | Brown et al. | |
| 2011/0074766 A1 | 3/2011 | Page et al. | |
| 2011/0107246 A1 | 5/2011 | Vik | |
| 2011/0115787 A1 | 5/2011 | Kadlec | |
| 2011/0161133 A1 | 6/2011 | Staveley et al. | |

FOREIGN PATENT DOCUMENTS

| | | |
|---|---|---|
| EP | 1230566 | 2/2005 |
| WO | 00/14574 | 3/2000 |
| WO | WO 2005/033739 | 4/2005 |
| WO | 2008/121950 | 10/2008 |
| WO | 2009/039422 | 3/2009 |
| WO | 2009/148681 | 12/2009 |
| WO | 2011/038221 | 3/2011 |

OTHER PUBLICATIONS

Speray, D. et al. (1990), "Volume Probe: Interactive Data Exploration on Arbitrary Grids", Computer Graphics, v. 24, No. 5, 8 pgs.

* cited by examiner

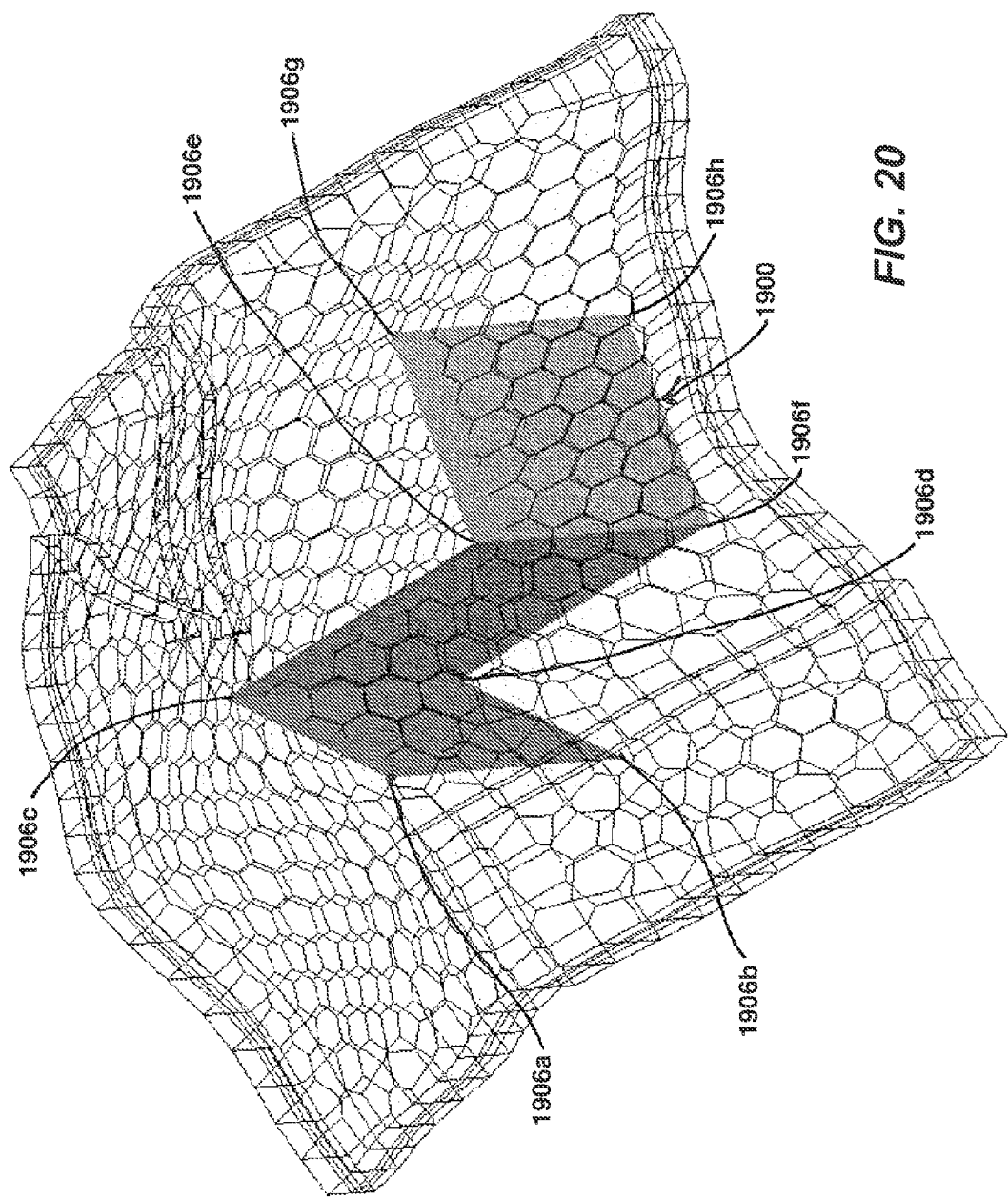

SYSTEM AND METHOD FOR PROVIDING DATA CORRESPONDING TO PHYSICAL OBJECTS

CROSS-REFERENCE TO RELATED APPLICATIONS

This application claims the benefit of U.S. Provisional Patent Application 61/373,334, filed Aug. 13, 2010, entitled SYSTEM AND METHOD FOR PROVIDING DATA CORRESPONDING TO PHYSICAL OBJECTS, the entirety of which is incorporated by reference herein.

This application also relates to Provisional U.S. Application No. 61/311,577, Filed Mar. 8, 2010 and titled "System and Method for Providing Data Corresponding to Physical Objects," with inventors Marek Czernuszenko et al., and to Provisional U.S. Application No. 61/328,052, filed Apr. 26, 2010 and titled "System and Method for Providing Data Corresponding to Physical Objects," with inventors Marek Czernuszenko et al., the disclosures of which are incorporated by reference herein in their entirety for all purposes.

FIELD OF THE INVENTION

The present techniques relate to providing three-dimensional (3D) data and/or visualizations of data corresponding to physical objects and analysis thereof. In particular, an exemplary embodiment of the present techniques relates to providing visualizations of user-selected portions of a fully unstructured grid.

BACKGROUND

This section is intended to introduce various aspects of the art, which may be associated with embodiments of the disclosed techniques. This discussion is believed to assist in providing a framework to facilitate a better understanding of particular aspects of the disclosed techniques. Accordingly, it should be understood that this section is to be read in this light, and not necessarily as admissions of prior art.

Three-dimensional (3D) model construction and visualization have been widely accepted by numerous disciplines as a mechanism for analyzing, communicating, and comprehending complex 3D datasets. Examples of structures that can be subjected to 3D analysis include the earth's subsurface, facility designs and the human body, to name just three examples.

The ability to easily interrogate and explore 3D models is one aspect of 3D visualization. Relevant models may contain both 3D volumetric objects and co-located 3D polygonal objects. Examples of volumetric objects are seismic volumes, MRI scans, reservoir simulation models, and geologic models. Interpreted horizons, faults and well trajectories are examples of polygonal objects. In some cases, there is a need to view the volumetric and polygonal objects concurrently to understand their geometric and property relations. If every cell of the 3D volumetric object is rendered fully opaque, other objects in the scene will of necessity be occluded, and so it becomes advantageous at times to render such volumetric objects with transparency so that other objects may be seen through them. These 3D model interrogation and exploration tasks are important during exploration, development and production phases in the oil and gas industry. Similar needs exist in other industries.

3D volumetric objects may be divided into two basic categories: structured grids and unstructured grids. Those of ordinary skill in the art will appreciate that other types of grids may be defined on a spectrum between purely structured grids and purely unstructured grids. Both structured and unstructured grids may be rendered for a user to explore and understand the associated data. There are large numbers of known volume rendering techniques for structured grids. Many such known techniques render a full 3D volume with some degree of transparency, which enables the user to see through the volume. However, determining relations of 3D object properties is difficult, because it is hard to determine the exact location of semi-transparent data.

A first known way to view and interrogate a 3D volume is to render a cross-section through the 3D volume. The surface of the intersection between the cross-section and the 3-D volume may be rendered as a polygon with texture-mapped volume cell properties added thereto. In the case of a structured grid such as seismic or a medical scan, the user can create cross-sections along one of the primary directions: XY (inline or axial), XZ (cross-line or coronal) and YZ (time slice or sagittal). A traditional cross-section spans the extent of the object. In this case other objects such as horizons, wells or the like are partially or completely occluded and it is difficult to discern 3D relationships between objects.

This effect is shown in FIG. 1, which is a 3D graph 100 of a subsurface region. The graph 100, which may provide a visualization of 3D data for a structured grid or an unstructured grid, shows a first cross-section 102, a second cross-section 104, a third cross-section 106 and a fourth cross-section 108. Each of the four cross-sections shown in FIG. 1 is chosen to allow a user to see data in a physical property model that comprises data representative of a property of interest. However, a first horizon 110 and a second horizon 112, as well as data displayed on cross-sections 102, 104 and 106 which also may be of interest to a user, are mostly obscured or occluded by the visualizations of the four cross-sections.

A ribbon section, also called an arbitrary vertical cross-section, is one attempt to make traditional cross-sectional visual representations more flexible. To create a ribbon section, the user digitizes a polyline on one face of a volume bounding box. The polyline is extruded vertically through the volume creating a curtain or ribbon, and the volumetric data from the intersection of the ribbon with the volume is painted on the curtain surface.

This concept of arbitrary vertical cross-sections (i.e. ribbon sections) is depicted in FIG. 2, which is a 3D graph 200 of a subsurface region showing an arbitrary vertical cross-section defined by a polyline having two segments. The graph 200, which may provide a visualization of 3D data for a structured grid or an unstructured grid, shows an arbitrary vertical cross-section defined by a first line segment 202 and a second line segment 204. Although the arbitrary cross-section shown in FIG. 2 is less intrusive than the cross-sections shown in FIG. 1, portions of a first horizon 206 and a second horizon 208 are still occluded as long as the arbitrary cross-section is displayed.

U.S. Pat. Nos. 7,098,908 and 7,248,258 disclose a system and method for analyzing and imaging 3D structured grids using ribbon sections. In one disclosed system, a ribbon section is produced which may include a plurality of planes projected from a polyline. The polyline includes one or more line segments preferably formed within a plane. The projected planes intersect the 3D volume data set and the data located at the intersection may be selectively viewed. The polyline may be edited or varied by editing or varying the control points which define the polyline. Physical phenomena represented within the three-dimensional volume data set may be tracked. A plurality of planes may be successively displayed in the three-dimensional volume data set from which points are digitized related to the structure of interest to create a spline curve on each plane. The area between the spline curves is interpolated to produce a surface representative of the structure of interest, which may for example be a fault plane described by the three-dimensional volume data set. This may allow a user to visualize and interpret the features and physical parameters that are inherent in the three-dimensional volume data set.

Some 3D visualization techniques are suitable for grid structures that fall between fully structured grids and fully unstructured grids. One such visualization technique relates to the use of reservoir simulation grids based on geologic models.

As used herein, the term "geologic model" refers to a model that is topologically structured in I,J,K space but geometrically varied. A geologic model may be defined in terms of nodes and cells. Geologic models can also be defined via pillars (columnar cells or 2.5D grid—i.e. a 3D grid extruded from a 2D grid). A geologic model may be visually rendered as a shell (i.e. a volume with data displayed only on outer surfaces).

As noted, a geologic model may be thought of as an intermediate step between completely structured and completely unstructured grids. In its simplest form, a geologic model may comprise a structured grid with deformed geometry. In a geologic model, cells may be uniquely addressable, but their geometries are not entirely implicit. Because of deformation, a cell's corner vertices cannot be calculated from just the grid origin and unit vectors along with the cell's indices. However, each cell is still a polyhedron with six faces. An index may be used to find its neighbors. Each cell (except the boundary faces) shares six faces with other cells, and shares eight corners with other cells. Neighboring cells sharing a vertex may also be addressed. Those of ordinary skill in the art will appreciate that there may be variations on this basic definition of a geologic model. For example, a geologic model may comprise keyed out cells, faults and pinch outs. However, the basic indices still apply and the majority of cells comprise six-faced polyhedrons. In addition, reservoir simulation grids that are based on geologic models may retain (i, j, k) cell indices, while explicitly storing cell geometries.

U.S. Pat. No. 6,106,561 discloses a reservoir simulation grid that is based on a geologic model. The grid is produced by a simulation gridding program that includes a structured gridder. The structured gridder includes a structured areal gridder and a block gridder. The structured areal gridder builds an areal grid on an uppermost horizon of an earth formation by performing the following steps: (1) building a boundary enclosing one or more fault intersection lines on the horizon, and building a triangulation that absorbs the boundary and the faults; (2) building a vector field on the triangulation; (3) building a web of control lines and additional lines inside the boundary which have a direction that corresponds to the direction of the vector field on the triangulation, thereby producing an areal grid; and (4) post-processing the areal grid so that the control lines and additional lines are equi-spaced or smoothly distributed. The block gridder of the structured gridder will drop coordinate lines down from the nodes of the areal grid to complete the construction of a three dimensional structured grid. A reservoir simulator will receive the structured grid and generate a set of simulation results which are displayed on a 3D viewer for observation by a workstation operator.

U.S. Pat. No. 6,018,497 describes a system having a single grid made up of a mixture of structured and unstructured elements. Unstructured cells are used around wells because there is higher resolution data in these areas. Other areas are represented by regular grid cells. The software generates (i, j, k) indices for the whole grid, so at the end the grid has the characteristics of a structured grid and it may be classified as a semi-structured grid. In particular, a method and apparatus generates grid cell property information that is adapted for use by a computer simulation apparatus which simulates properties of an earth formation located near one or more wellbores. An interpretation workstation includes at least two software programs stored therein: a first program and a second simulation program which is responsive to output data produced from the first program for generating a set of simulation results. The set of simulation results are displayed on a workstation display monitor of the workstation. The first program will: receive well log and seismic data which indicates the location of each layer of a formation near a wellbore, and then grid each layer of the formation, the grid being comprised of a plurality of cells. The first program will then generate more accurate data associated with each cell, such as the transmissibility of well fluid through each cell. The more accurate data for each cell originating from the first program will be transmitted to the second simulation program. The second simulation program will respond to the more accurate data for each cell of the grid from the first program by generating a set of more accurate simulation results for each cell of the grid. The second simulation program will overlay the more accurate simulation result for each cell onto each of the corresponding cells of the grid which is being generated and displayed on the workstation display by the first program. As a result, the workstation will display each layer of the earth formation where each layer is gridded with a plurality of cells, and each cell has its own particular color which corresponds in numerical value to the particular more accurate simulation result (e.g., pressure or saturation) that corresponds to that cell.

Another known attempt to provide a 3D visualization is for a user to render one or more subsets of 3D structured grid data. This technique is called volume probing or volume roaming (SGI OpenGL Volumizer Programmer's Guide) or alternatively just probing, as discussed in U.S. Pat. Nos. 6,765,570 and 6,912,468. The subsets may be created, resized, shaped, and moved interactively by the user within the whole 3D volume data set. As a subset changes shape, size, or location in response to user input, the image is redrawn at a rate so as to be perceived as real-time by the user. In this manner, the user is allegedly able to visualize and interpret the features and physical parameters that are inherent in the 3D volume data set.

FIG. 3 is a 3D graph 300 of a subsurface region showing an area of interest identified by a 3-D data subset. The graph 300, which may provide a visualization of 3D data for a structured grid or an unstructured grid, shows a 3D data subset 302. A first horizon 304 and a second horizon 306 are also shown. In the graph 300, the second horizon 306 is partially occluded by the 3D data subset 302. Because of the manner in which the data subset 302 was selected, it cannot easily be moved to reveal the occluded portion of the second horizon 306.

Another approach to rendering 3D object properties is the use of isosurfaces, which represent data points having the same or similar property values. An isosurface is a 3D analog to a contour line on a map, which connects points of the same elevation. Contour lines on a 2D map allow an understanding of the location of mountains and valleys, even though the map is flat. Similarly, isosurfaces can help provide an understanding of property distribution in a 3D volume. There are number of ways to create isosurfaces. One such algorithm is known as a marching cube algorithm. This technique, however, is not widely used to visualize seismic data, because seismic property values change by a large amount every time a sedimentary layer is encountered. If isosurfaces are rendered in seismic data, the result would be a visualization resembling a large number of pancake-like surfaces stacked on top each other. Accordingly, isosurfaces are not commonly used in the oil and gas industry.

FIG. 4 is an isosurface rendering 400 of an unstructured grid. The isosurface rendering 400 comprises a first isosurface 402, a second isosurface 404, and third isosurfaces 406. Each of the first isosurface 402, the second isosurface 404, and the third isosurfaces 406 represent surfaces, each of which represents a common parameter value in a 3D region.

Another technique for displaying data corresponding to a 3D region is volume rendering a space with different attributes corresponding to different values of a parameter of interest. For example, different regions of the 3D region may be shaded in different colors based on variations in a parameter of interest.

FIG. 5 is a volume rendering 500 of an unstructured grid. The volume rendering 500 comprises a first region 502 and a second region 504. The first region 502 and the second region 504 are shaded differently to indicate that the value of a parameter of interest is in a different range in the first region 502 relative to the second region 504.

Another known method of producing visualizations of data represented in a structured grid relates to the use of a probe. A user can quickly explore a 3D volume by moving the probe. U.S. Pat. No. 6,765,570 discloses a system and method for analyzing and imaging 3D volume data sets using a 3D sampling probe. According to a disclosed system, a number of sampling probes can be created, shaped, and moved interactively by the user within the whole 3D volume data set. As the sampling probe changes shape, size, or location in response to user input, the image is re-drawn at a rate so as to be perceived as real-time by the user. In this manner, the user is allegedly able to visualize and interpret the features and physical parameters that are inherent in the 3D volume data set.

U.S. Pat. No. 6,912,468 discloses a method and apparatus for contemporaneous utilization of a higher order probe in pre-stack and post-stack seismic domains. The disclosed method includes initiating a higher order probe at a three-dimensional coordinate in a post-stack seismic volume and instantiating a pre-stack seismic data content for the higher order probe.

A publication by Speray, D. and Kennon, S., entitled "Volume Probe: Interactive Data Exploration on Arbitrary Grids", Computer Graphics, November, 1990 describes a technique for probing an unstructured grid using one or three sheets where a sheet is a planar cutting surface that may have limited extents. This functionality is very limiting in that the planar sheets can not represent real objects and probing with real objects is a significant advantage to users.

U.S. Patent Application Publication No. 2009/0303233 describes a system and method for probing geometrically irregular grids. The disclosure specifically relates to systems and methods for imaging a 3D volume of geometrically irregular grid data. Various types of probes and displays are used to render the geometrically irregular grid data, in real-time, and analyze the geometrically irregular grid data. The grids described require topologically regular I,J,K indexing. This indexing is a requirement for the described probing technique, which significantly limits the types of data on which the described method can operate.

Thus, numerous techniques exist for providing visualizations for data in the context of a structured grid. A system and method of providing visualizations for data organized in an unstructured grid is desirable.

SUMMARY

An exemplary embodiment of the present techniques comprises a method for providing a visualization of data describing a physical structure. The exemplary method comprises defining an unstructured grid that corresponds to a three-dimensional physical structure. The unstructured grid may comprise data representative of a property of interest. The exemplary method also comprises defining a probe as an object that comprises a set of topological elements, at least one of which does not share a common plane. The exemplary method additionally comprises providing a visualization of the unstructured grid data on the geometry defined by the probe.

According to an exemplary embodiment of the present techniques, the probe may comprise a three-dimensional polyhedron, a sphere, or any closed three-dimensional surface.

A volume rendering may be produced within a closed space defined by the probe. A volume rendering may also be produced within a space defined by a distance and/or direction from the probe. Additionally, a structured grid may be defined within a space defined by the probe, with a volume rendering being produced therein.

A method according to an exemplary embodiment of the present techniques may comprise moving the probe to a different location. In addition, such a method may comprise providing a visualization of the unstructured grid on the geometry defined by the probe.

According to other aspects, the probe may be defined by a distance, such as a directionless distance or a vector distance, from a separate object, which may be a geologic feature of interest. An offset distance may be defined from a separate object, and the probe may be defined using a vector distance from the offset. The probe may be defined based on an intersection of the unstructured grid and a separate object. A second probe may be defined as an object that comprises a set of topological elements, at least one of which does not share a common plane, and a combined probe may be defined as an object that is the product of a Boolean operation on the probes. First and second probes may be linked such that movement of one of the probes is reflected by movement of the other of the probes.

According to still other aspects, the definition of the probe may be modified such that the probe has a changed geometry, and a visualization of the unstructured grid on the probe may be provided. Modifying the definition of the probe may include changing a location of less than all vertices defining the probe, or may include adding or deleting vertices to the probe. Time-based changes to the probe, the probe geometry, the geometry of the unstructured grid, and/or the data may be accounted for, and a visualization of such time-based changes may be provided.

One exemplary embodiment according to the present techniques relates to a computer system that is adapted to provide a visualization of data describing a physical structure. The computer system may comprise a processor and a tangible, machine-readable storage medium that stores machine-readable instructions for execution by the processor. The machine-readable instructions may comprise code that, when executed by the processor, is adapted to cause the processor to define an unstructured grid that corresponds to a three-dimensional physical structure, the unstructured grid comprising data representative of a property of interest. The machine-readable instructions may also comprise code that, when executed by the processor, is adapted to cause the processor to define a probe as an object that comprises a set of topological elements, at least one of which does not share a common plane. The machine-readable instructions may additionally comprise code that, when executed by the processor, is adapted to cause the processor to provide a visualization of the unstructured grid data on the geometry defined by the probe.

In an exemplary computer system, the probe may comprise a three-dimensional polyhedron, a sphere or any closed three-dimensional surface.

An exemplary computer system recited may comprise code that, when executed by the processor, is adapted to cause the processor to produce a volume rendering within a closed space defined by the probe. Another exemplary computer system may comprise code that, when executed by the processor, is adapted to cause the processor to produce a volume rendering within a space defined by a distance and/or a direction from the probe.

Exemplary computer systems according to the present techniques may comprise code that, when executed by the processor, is adapted to cause the processor to define a structured grid within a space defined by the probe. Such exemplary computer systems may also comprise code that, when executed by the processor, is adapted to cause the processor to produce a volume rendering within the structured grid.

In addition, exemplary computer systems may comprise code that, when executed by the processor, is adapted to cause the processor to move the probe to a different location. Such exemplary computer systems may also comprise code that, when executed by the processor, is adapted to cause the processor to provide a visualization of the unstructured grid on the geometry defined by the probe.

An exemplary embodiment of the present techniques relates to a method for producing hydrocarbons from an oil and/or gas field using a visualization of data describing a physical structure. Such an exemplary method may comprise defining an unstructured grid that corresponds to a three-dimensional physical structure of the oil and/or gas field. The unstructured grid may comprise data representative of a property of interest in the oil and/or gas field. The exemplary method also comprises defining a probe as an object that comprises a set of topological elements, at least one of which does not share a common plane. A visualization of the unstructured grid data may be produced on the geometry defined by the probe. The exemplary method additionally comprises extracting hydrocarbons from the oil and/or gas field based on the visualization.

DESCRIPTION OF THE DRAWINGS

Advantages of the present techniques may become apparent upon reviewing the following detailed description and the accompanying drawings in which:

FIG. 20 is a perspective view of the unstructured grid and probe of FIG. 19 after some of the vertices defining the probe have been moved relative to the unstructured grid.

DETAILED DESCRIPTION

Figure 1:
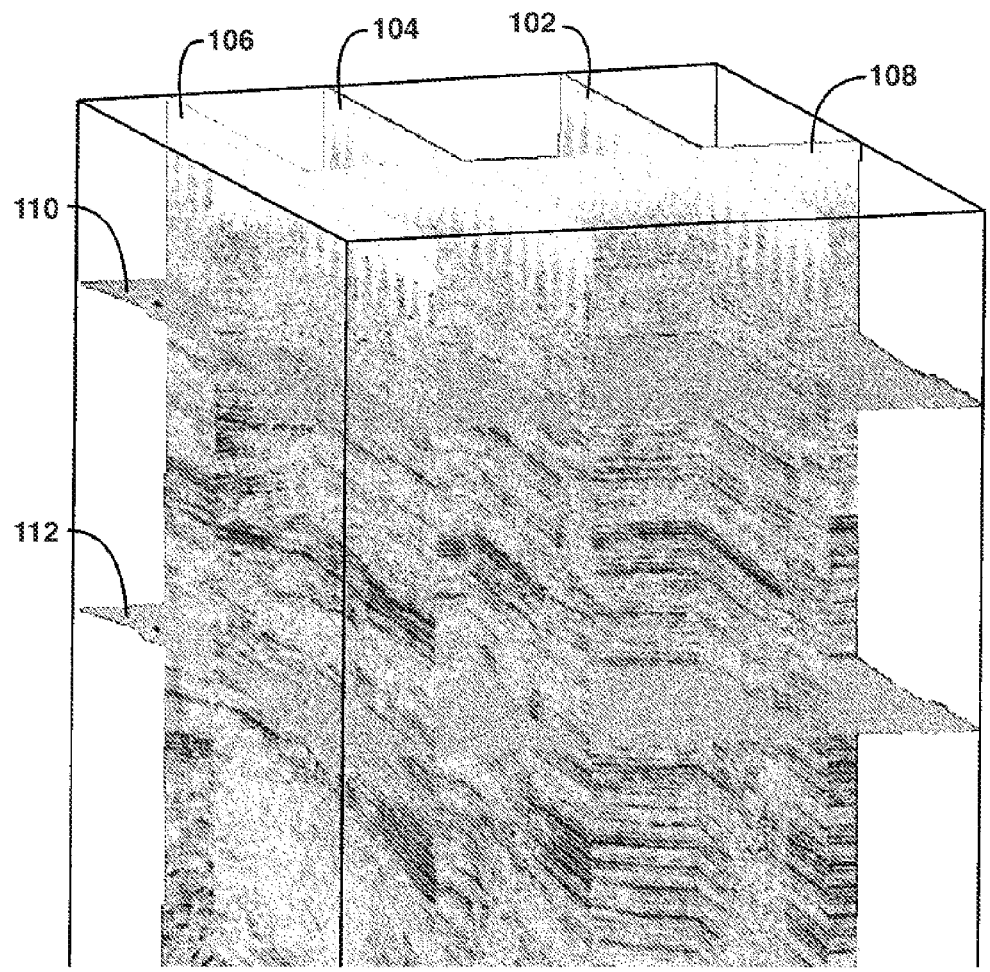
FIG. 1 is a 3D graph of a subsurface region showing a combination of four cross-sections with two horizons mostly occluded.
Figure 2:
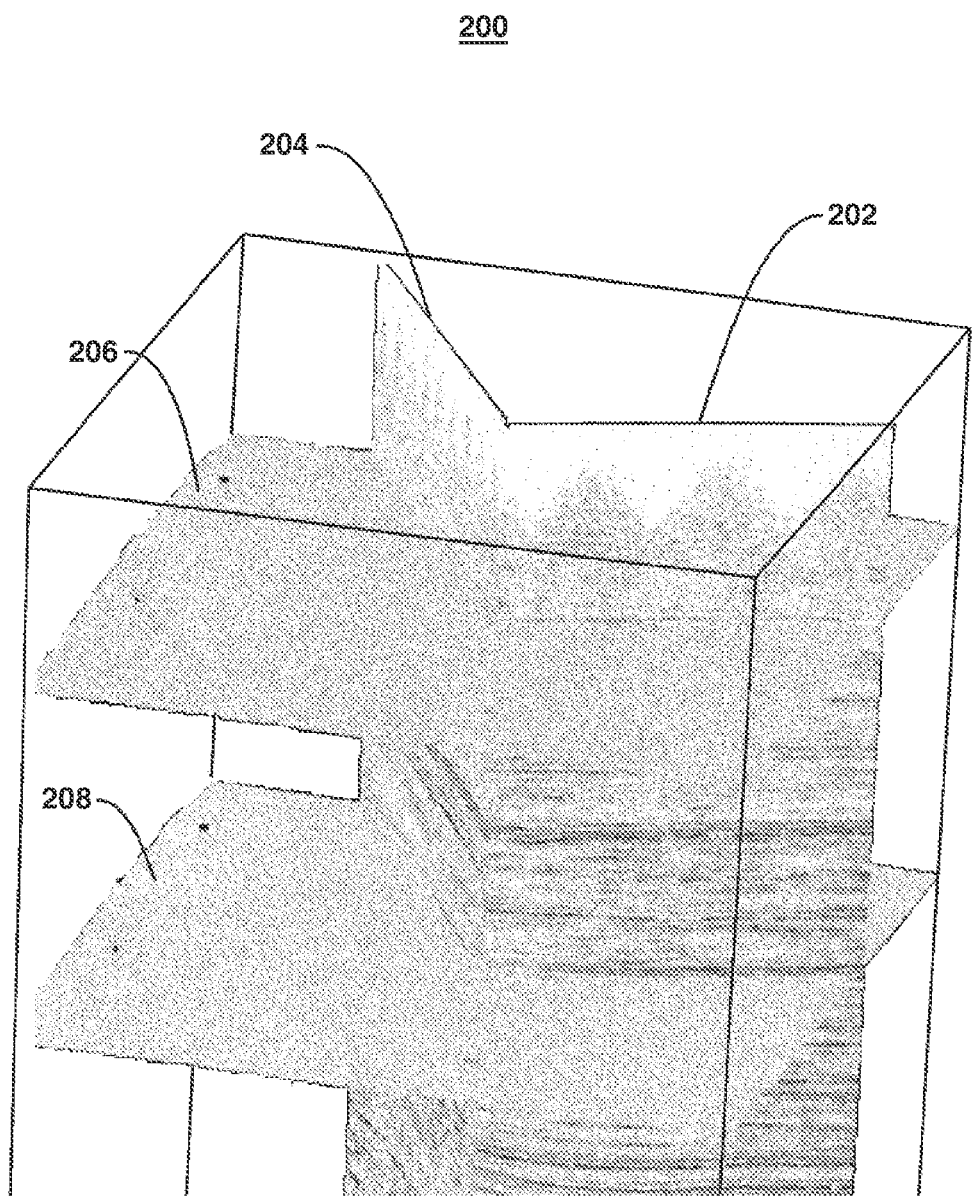
FIG. 2 is a 3D graph of a subsurface region showing an arbitrary vertical cross-section with two horizons partially occluded.
Figure 3:
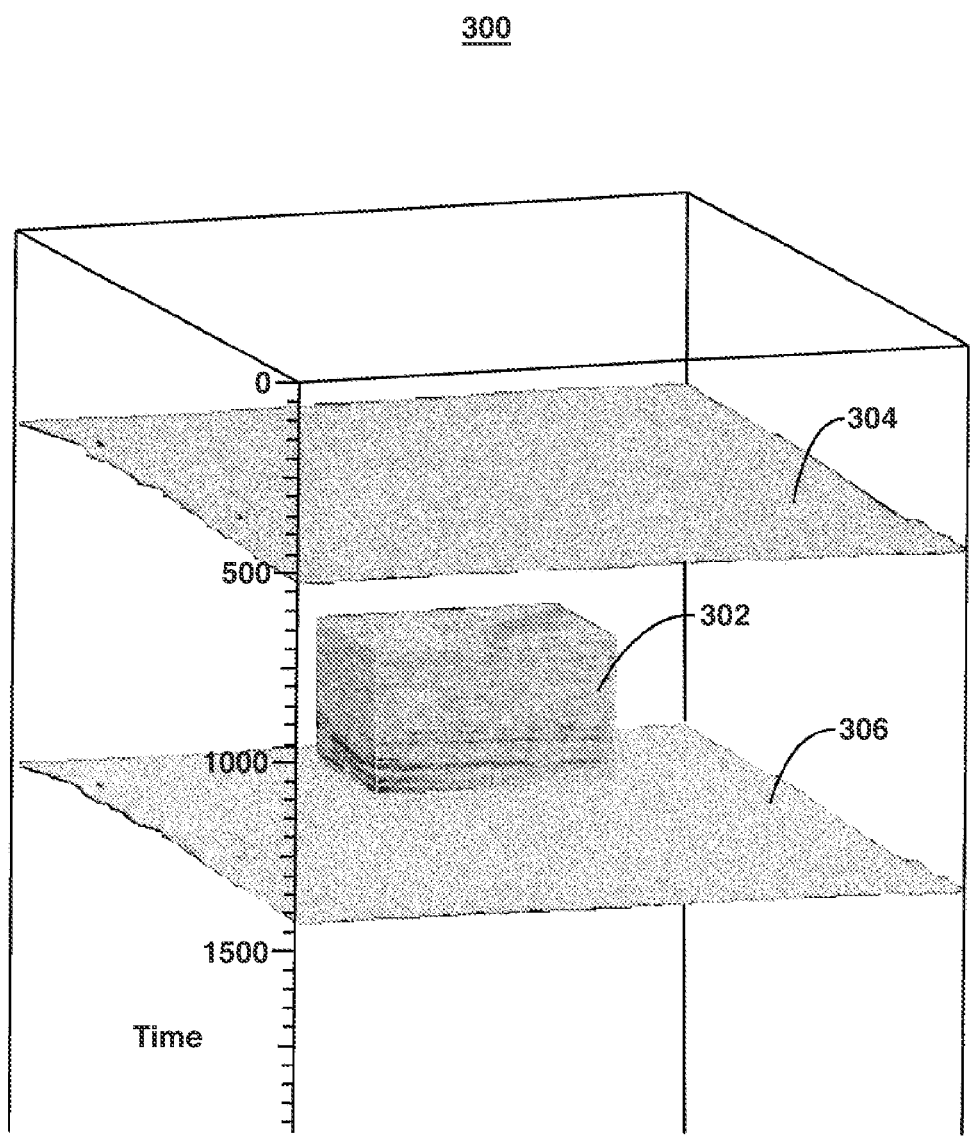
FIG. 3 is a 3D graph of a subsurface region showing a region of interest identified by a sub-volume probe with one horizon partially occluded.
Figure 4:
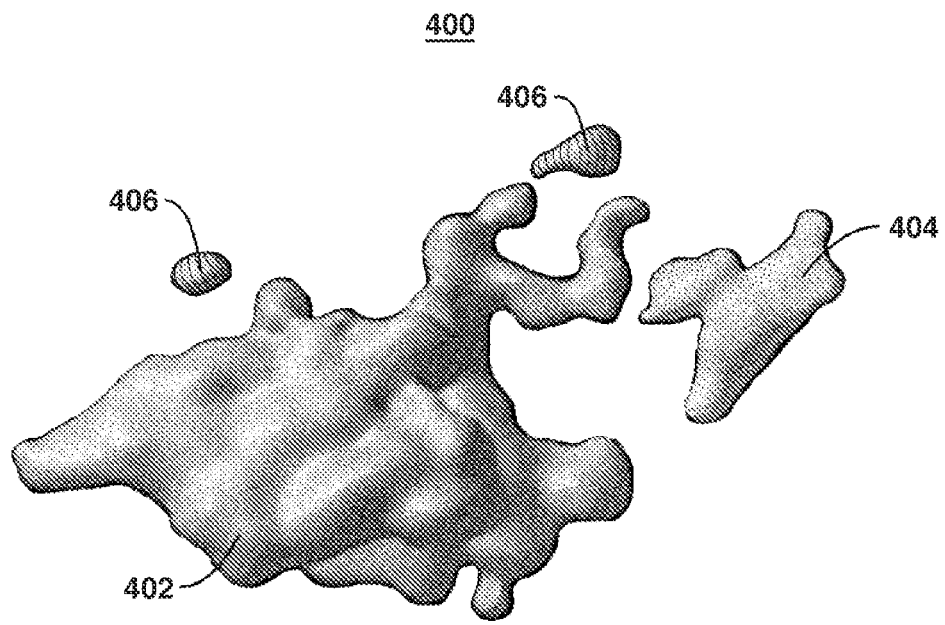
FIG. 4 is an isosurface rendering of an unstructured grid.
Figure 5:
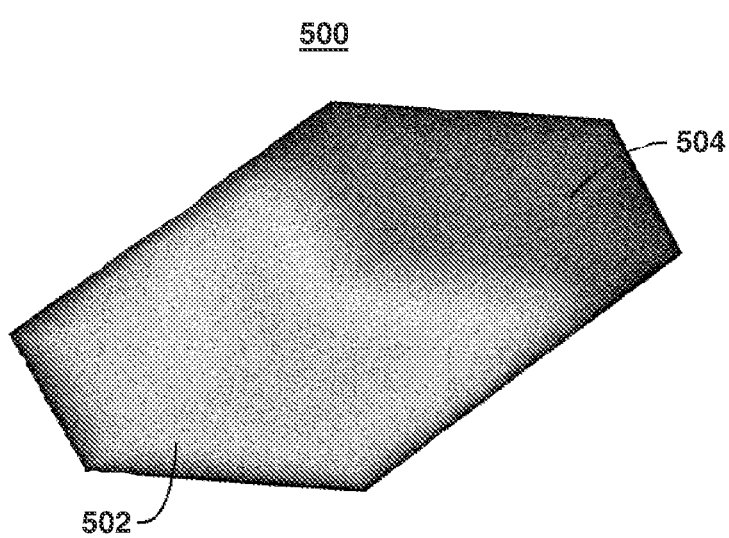
FIG. 5 is a volume rendering of an unstructured grid.

In the following detailed description section, specific embodiments are described in connection with preferred embodiments. However, to the extent that the following description is specific to a particular embodiment or a particular use, this is intended to be for exemplary purposes only and simply provides a description of the exemplary embodiments. Accordingly, the present techniques are not limited to embodiments described herein, but rather, it includes all alternatives, modifications, and equivalents falling within the spirit and scope of the appended claims.

At the outset, and for ease of reference, certain terms used in this application and their meanings as used in this context are set forth. To the extent a term used herein is not defined below, it should be given the broadest definition persons in the pertinent art have given that term as reflected in at least one printed publication or issued patent.

As used herein, the term "3D seismic data volume" refers to a 3D data volume of discrete x-y-z or x-y-t data points, where x and y are not necessarily mutually orthogonal horizontal directions, z is the vertical direction, and t is two-way vertical seismic signal travel time. In subsurface models, these discrete data points are often represented by a set of contiguous hexahedrons known as cells or voxels. Each data point, cell, or voxel in a 3D seismic data volume typically has an assigned value ("data sample") of a specific seismic data attribute such as seismic amplitude, acoustic impedance, or any other seismic data attribute that can be defined on a point-by-point basis.

As used herein, the term "cell" refers to a closed volume formed by a collection of faces, or a collection of nodes that implicitly define faces.

As used herein, the term "computer component" refers to a computer-related entity, either hardware, firmware, software, a combination thereof, or software in execution. For example, a computer component can be, but is not limited to being, a process running on a processor, a processor, an object, an executable, a thread of execution, a program, and/or a computer. One or more computer components can reside within a process and/or thread of execution and a computer component can be localized on one computer and/or distributed between two or more computers.

As used herein, the terms "computer-readable medium" or "tangible machine-readable medium" refer to any tangible storage that participates in providing instructions to a processor for execution. Such a medium may take many forms, including but not limited to, non-volatile media, and volatile media. Non-volatile media includes, for example, NVRAM, or magnetic or optical disks. Volatile media includes dynamic memory, such as main memory. Computer-readable media may include, for example, a floppy disk, a flexible disk, hard disk, magnetic tape, or any other magnetic medium, magneto-optical medium, a CD-ROM, any other optical medium, a RAM, a PROM, and EPROM, a FLASH-EPROM, a solid state medium like a holographic memory, a memory card, or any other memory chip or cartridge, or any other physical medium from which a computer can read. When the computer-readable media is configured as a database, it is to be understood that the database may be any type of database, such as relational, hierarchical, object-oriented, and/or the like. Accordingly, exemplary embodiments of the present techniques may be considered to include a tangible storage medium or tangible distribution medium and prior art-recognized equivalents and successor media, in which the software implementations embodying the present techniques are stored.

As used herein, the term "cross-section" refers to a plane that intersects a structured grid or an unstructured grid.

As used herein, the term "face" refers to a collection of vertices.

As used herein, the term "filter" refers to the selection of a subset of 3D model topological elements (e.g. nodes, faces, cells) based on some selection criteria. Such criteria may be explicit, such as the selection of elements in a given list, or may be defined procedurally. Such procedural criteria may include, but are not limited to, selection of elements within some particular range or ranges of property values, within some proximity to features of interest, and/or any combination (intersection, union, difference, etc.) of other filters. Filter results are often visualized to provide users a better understanding of their data. Additional processing might also occur due to filter results.

As used herein, the term "filter object" refers to a 3D construct having a geometry not defined in terms of a structured or unstructured grid. For example, a filter object for a 3D model may be defined as a well path, horizon, polyline, point-set, closed or open surface, or a horizon.

As used herein, the term "horizon" refers to a geologic boundary in the subsurface structures that are deemed important by an interpreter. Marking these boundaries is done by interpreters when interpreting seismic volumes by drawing lines on a seismic section. Each line represents the presence of an interpreted surface at that location. An interpretation project typically generates several dozen and sometimes hundreds of horizons. Horizons may be rendered using different colors so that they stand out in a 3D visualization of data.

As used herein, the term "I,J,K space" refers to an internal coordinate system for a geo-cellular model, having specified integer coordinates for (i,j,k) for consecutive cells. By convention, K represents a vertical coordinate. I,J,K space may be used as a sample space in which each coordinate represents a single sample value without reference to a physical characteristic.

As used herein, the term "node" refers to a point defining a topological location in I,J,K space. If a split or fault condition is associated with the node, that node may have more than one point associated therewith.

As used herein, the term "plane" refers to a two-dimensional surface. A plane may be flat or curved.

As used herein, the term "probe" refers to a 3D object that is used to display grid data. Probes may be open or closed surfaces, horizons, faults, 3D models, polylines, wells, point sets, ribbon sections (i.e. traverses, vertical arbitrary cross-sections) or any other 3D construct. A probe visualization algorithm displays grid data on the probe or volume renders the grid data inside a closed area defined by the probe.

As used herein, the term "structured grid" refers to a matrix of volume data points known as voxels. Structured grids may be used with seismic data volumes.

As used herein, the term "seismic data" refers to a multi-dimensional matrix or grid containing information about points in the subsurface structure of a field, where the information was obtained using seismic methods. Seismic data typically is represented using a structured grid. Seismic attributes or properties are cell- or voxel-based. Seismic data may be volume rendered with opacity or texture mapped on a surface.

As used herein, the term "simulation model" refers to a structured grid or an unstructured grid with collections of points, faces and cells.

As used herein, the term "stacking" is a process in which traces (i.e., seismic data recorded from a single channel of a seismic survey) are added together from different records to reduce noise and improve overall data quality. Characteristics of seismic data (e.g., time, frequency, depth) derived from stacked data are referred to as "post-stack" but are referred to as "pre-stack" if derived from unstacked data. More particularly, the seismic data set is referred to being in the pre-stack seismic domain if unstacked and in the post-stack seismic domain if stacked. The seismic data set can exist in both domains simultaneously in different copies.

As used herein, the term "topological elements" refers to the building blocks of an object. Points, faces, or cells are the most common examples.

As used herein, the term "unstructured grid" refers to a collection of cells with arbitrary geometries. Each cell can have the shape of a prism, hexahedron, or other more complex 3D geometries. When compared to structured grids, unstructured grids can better represent actual data since unstructured grids can contain finer (i.e. smaller) cells in one area with sudden changes in value of a property, and coarser (i.e. larger) cells elsewhere where the value of the property changes more slowly. Finer cells may also be used in areas having more accurate measurements or data certainty (for example, in the vicinity of a well). The flexibility to define cell geometry allows the unstructured grid to represent physical properties better than structured grids. In addition, unstructured grid cells can also better resemble the actual geometries of subsurface layers because cell shape is not restricted to a cube and may be given any orientation. However, all cell geometries need to be stored explicitly, thus an unstructured grid may require a substantial amount of memory. Unstructured grids may be employed in connection with reservoir simulation models. Note that the term unstructured grid relates to how data is defined and does imply that the data itself has no structure. For example, one could represent a seismic model as an unstructured grid with explicitly defined nodes and cells. The result would necessarily be more memory intensive and inefficient to process and visualize than the corresponding structured definition.

As used herein, the terms "visualization engine" or "VE" refer to a computer component that is adapted to present a model and/or visualization of data that represents one or more physical objects.

As used herein, the term "voxel" refers to the smallest data point in a 3D volumetric object. Each voxel has unique set of coordinates and contains one or more data values that represent the properties at that location. Each voxel represents a discrete sampling of a 3D space, similar to the manner in which pixels represent sampling of the 2D space. The location of a voxel can be calculated by knowing the grid origin, unit vectors and the i, j, k indices of the voxel. As voxels are assumed to have similar geometries (such as cube-shaped), the details of the voxel geometries do not need to be stored, thus structured grids require relatively little memory. However, dense sampling may be needed to capture small features, therefore increasing computer memory usage requirements.

Some portions of the detailed description which follows are presented in terms of procedures, steps, logic blocks, processing and other symbolic representations of operations on data bits within a computer memory. These descriptions and representations are the means used by those skilled in the data processing arts to most effectively convey the substance of their work to others skilled in the art. In the present application, a procedure, step, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions using the terms such as "defining", "selecting", "displaying", "limiting", "processing", "computing", "obtaining", "predicting", "producing", "providing", "updating", "comparing", "determining", "adjusting" or the like, refer to the action and processes of a computer system, or similar electronic computing device, that transforms data represented as physical (electronic) quantities within the computer system's registers and memories into other data similarly represented as physical quantities within the computer system memories or registers or other such information storage, transmission or display devices. Example methods may be better appreciated with reference to flow diagrams.

While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various serially occurring actions, it is to be appreciated that various actions could occur concurrently, substantially in parallel, and/or at substantially different points in time.

As set forth below, exemplary embodiments of the present techniques relate to the investigation, interrogation and visualization of unstructured volumetric objects. More specifically, exemplary embodiments relate to the provision of visualizations of data represented in the form of an unstructured grid using techniques of probe selection and filtering.

An exemplary embodiment of the present techniques relates to a visualization engine or VE that supports volume rendered unstructured grids. Moreover, a VE according to the present techniques supports creating an unstructured probe type that allows clients to volume render inside a probe or to render properties on the probe faces.

A probe object according to the present technique may comprise another object describing a physical structure (e.g. a well, horizon, fault, or even another 3D model) or may be a non-planar synthetic object created by a user. Further, probe objects according to the present techniques can be closed and contain volume and allow for volume rendering inside this closed volume.

According to an exemplary embodiment of the present techniques, a probe provides a visualization of a model on the probe geometry. Moreover, the present techniques relate to identifying model data with a 3D object that is not defined by the geometry of the grid associated with the model data. Examples of probing according to an exemplary embodiment of the present techniques include selecting the unstructured grid data that is intersected by a well, or contained by a closed surface, or within some distance to another object and displaying the data on the probe. This is in contrast to a filter, which delineates a subset of the topological elements belonging to a model and visualizes the subset.

Exemplary embodiments of the present technique may be combined with other techniques to provide new workflows. For example, a model A may be filtered based on a surface B. The result may be used to probe a model C.

In addition, an exemplary embodiment of the present technique may be used on a completely unstructured data model and does not require an index domain. Thus, such an exemplary embodiment may operate in a similar manner on both geologic and simulation models as well as an unstructured grid.

Figure 6:
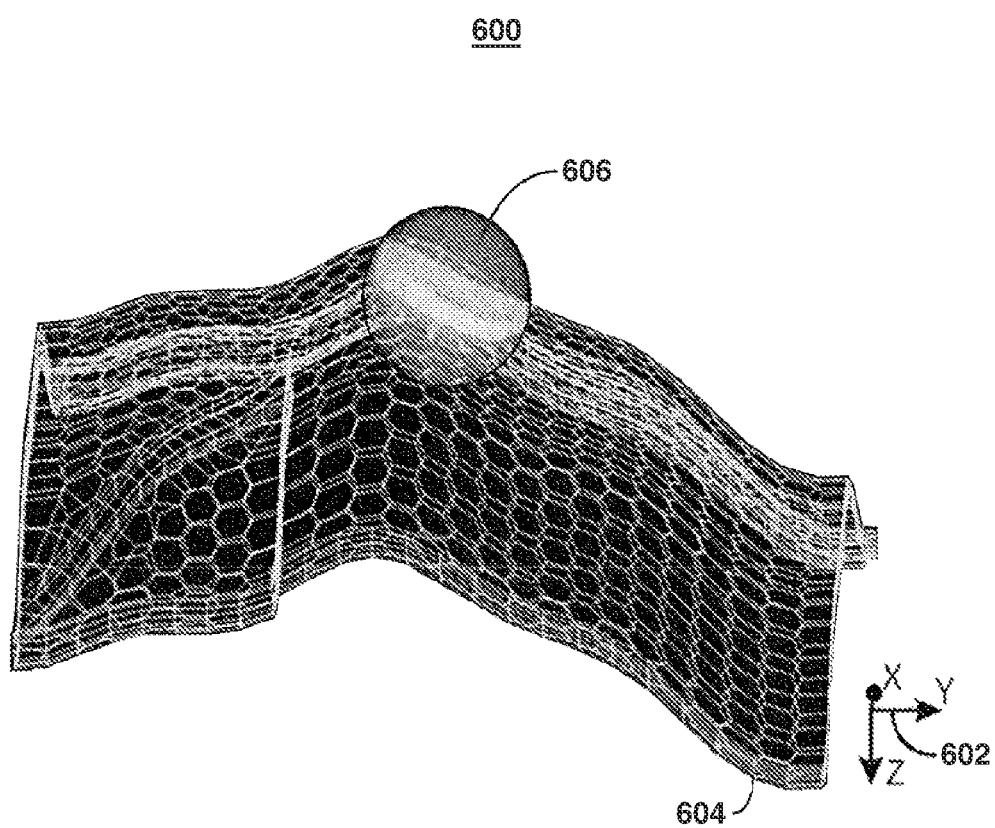
FIG. 6 is a 3D graph showing a probe region in an unstructured grid according to an exemplary embodiment of the present techniques.

FIG. 6 is a 3D graph showing a probe region in an unstructured grid according to an exemplary embodiment of the present techniques. The graph is generally referred to by the reference number 600. A legend 602 shows a directional reference for an x-axis, a y-axis and a z-axis.

The graph 600 shows an unstructured grid 604, which may correspond to a portion of a 3D space. The unstructured grid 604 represents a plurality of cells, each of which embodies data about a property of interest for the 3D space. Moreover, the cells are defined because they represent a region of the 3D space having a common value (or range of values) for the property of interest. The cells of the unstructured grid 604 are, therefore, defined by their data content relative to a property of interest (for example, porosity). The cells do not have a uniform geometry.

According to an exemplary embodiment of the present techniques, no visualization of the property of interest is shown for most of the unstructured grid 604. Moreover, the graph 600 shows a visualization of a probe region 606. The probe region 606, which may be referred to as a volume of interest herein, is located by a user in a portion of the unstructured grid for which the user wishes to observe the property of interest. In the exemplary embodiment shown in FIG. 6, the probe region 606 is generally spherical. Those of ordinary skill in the art will appreciate that the shape of the probe region may take the form of a wide range of geometries depending on specific applications. According to an exemplary embodiment of the present techniques, a probe is an object that comprises a set of topological elements, at least one of which does not share a common plane with the other topological elements that define the probe. This probe configuration allows a user to obtain data around a wide range of subsurface features including horizons, well paths, faults, surfaces, arbitrary vertical sections, arbitrary volumes, or the like.

Figure 12:
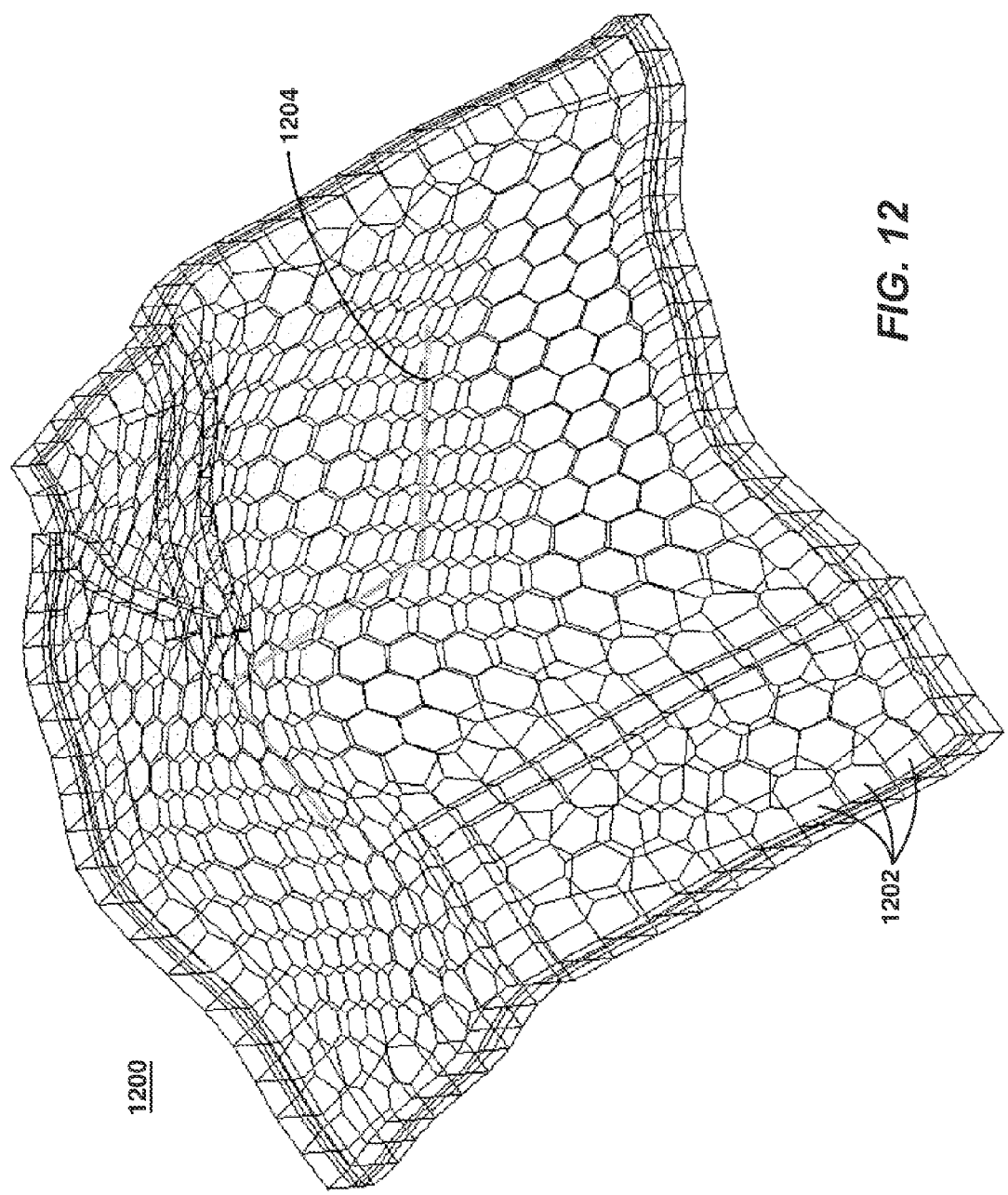
FIG. 12 is a perspective view of an unstructured grid and a line that may be used to define a probe therein.
Figure 13:
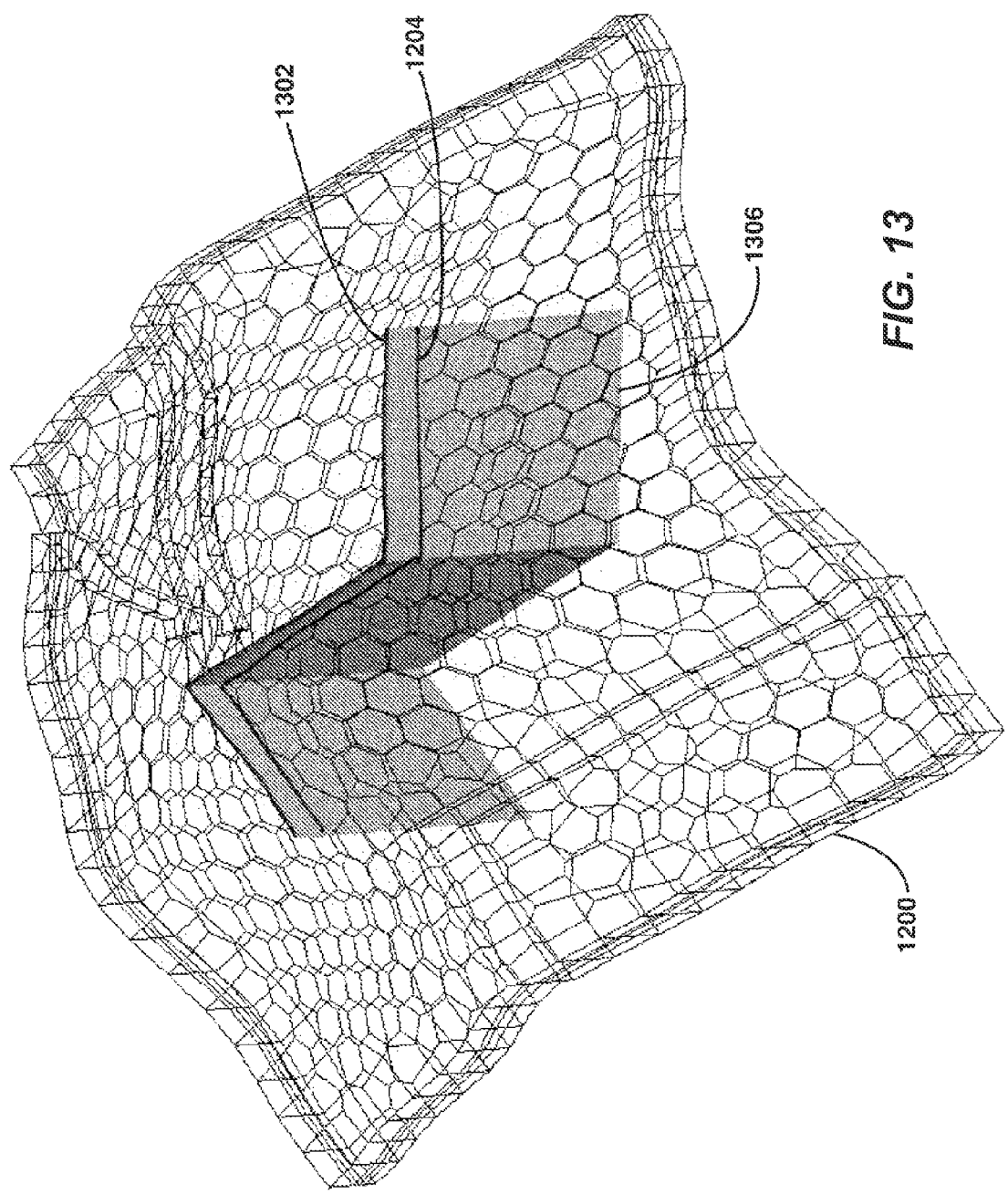
FIG. 13 is a perspective view of an unstructured grid and a probe defined by an offset from a line.

Probes can be created directly from one of the objects mentioned above or by some operation on them. A common example would be the creation of a probe that is a closed surface that represents some distance from a geologic feature of interest such as a horizon or fault. Thus the probe would render unstructured grid data only within a specified distance of the geologic feature of interest. In some cases a vector distance is more useful. In this case the distance is calculated along a 3D vector. Another probe creation operation would be creating a probe that is an iso-surface of one property or a probe object that represents the overlapping containment with the unstructured grid and a different model. FIG. 12 depicts an unstructured grid 1200 comprised of a plurality of variously shaped cells 1202. A line 1204 may be arbitrarily defined by the user. Alternatively, the user may define the line to approximate the location of a geologic or geometric feature present in the unstructured grid. Such selection may also be done automatically using a software-based feature recognition process. A probe may be defined as a closed surface within a specified distance from line 1204 or a vector distance from line 1204. Only unstructured grid data within the distance would be displayed. A probe defined by a directionless distance from line 1204 would resemble a tube or pipe surrounding the line, while a probe defined by a vector distance from the line would resemble a series of segmented planes having a height of the desired vector distance and extending from the line in the vector direction. The vector-defined probe could be created using a single vector that extends in one direction, or could also be created using two vectors having opposing directions. Still another example of a vector-defined probe is shown in FIG. 13, in which line 1204 has added to it an offset 1302 in the z-direction of the unstructured grid. A probe 1306 is defined by a vector distance in the opposite direction of the offset, which will extend back through the unstructured grid. Line 1204 is only one example of the many shapes or forms from which a distance may be measured to define a probe.

Figure 14:
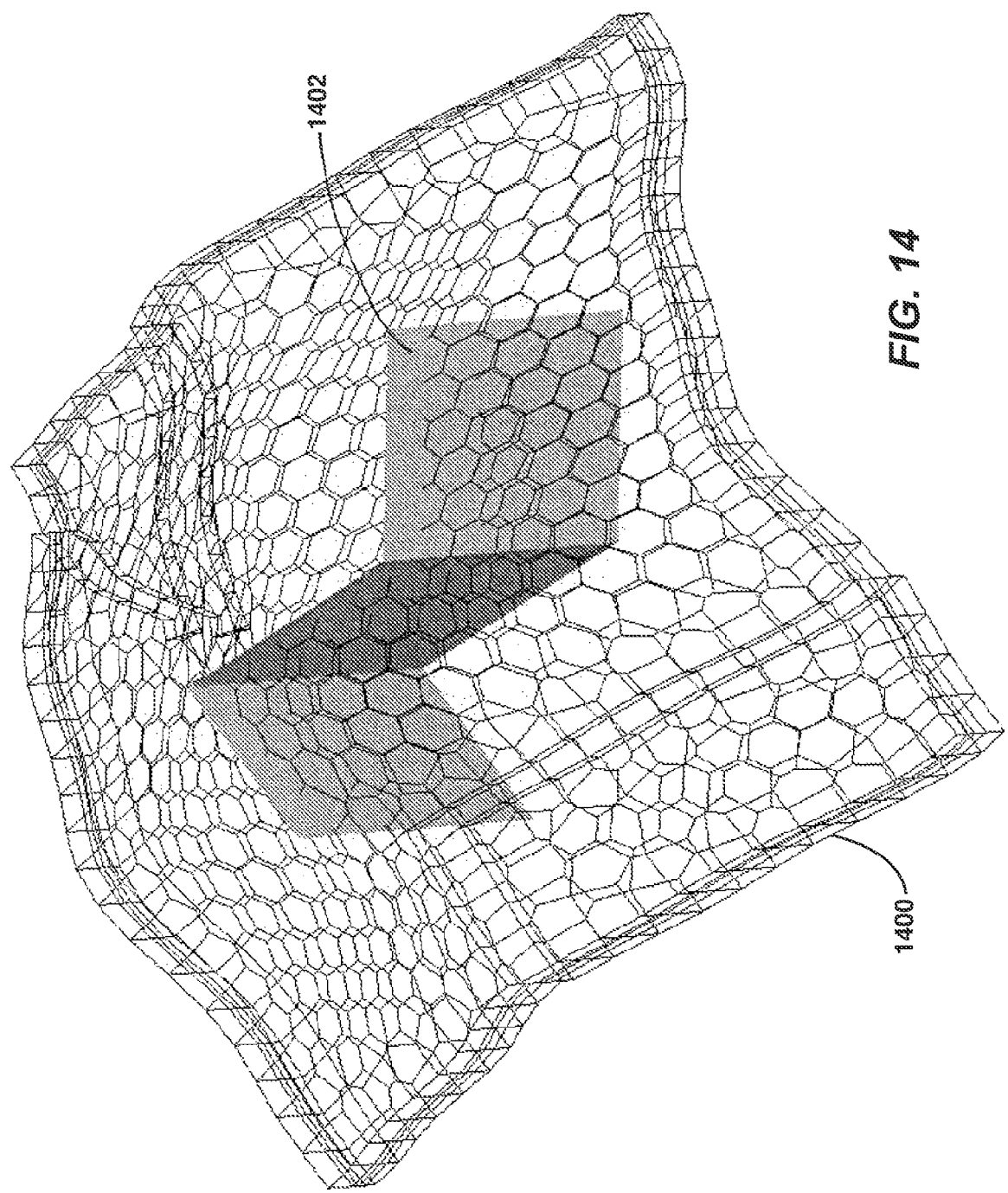
FIG. 14 is a perspective view of an unstructured grid and a user-defined surface.
Figure 15:
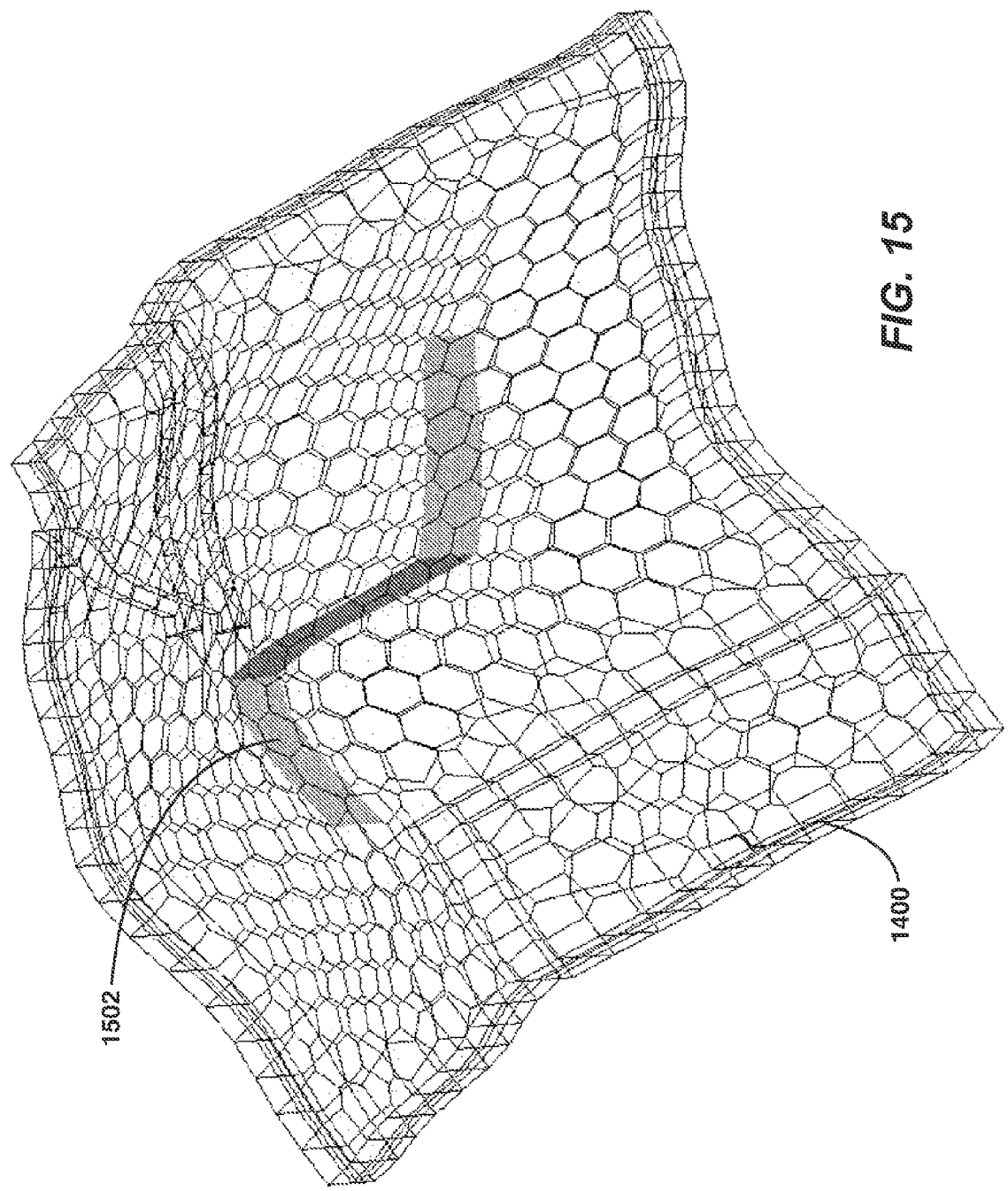
FIG. 15 is a perspective view of an unstructured surface defined by the intersection of the unstructured grid and the user-defined surface of FIG. 14.

Another useful technique is to create a probe that matches the geometry of a user-defined object or a subsurface object such as a horizon or fault, but has the topological intersection of both the unstructured grid and the user-defined or subsurface object. For example, FIG. 14 depicts an unstructured grid 1400 and a user-defined surface 1402. The intersection of the unstructured grid and the user-defined surface is shown in FIG. 15 as an unstructured surface 1502, which may then be used as a probe in the unstructured grid. Unstructured surface 1502 may include the contours or topological features of the unstructured grid 1400 and the user-defined surface 1402. Doing so allows for easy mapping of unstructured grid properties to the created probe for display.

Figure 16:
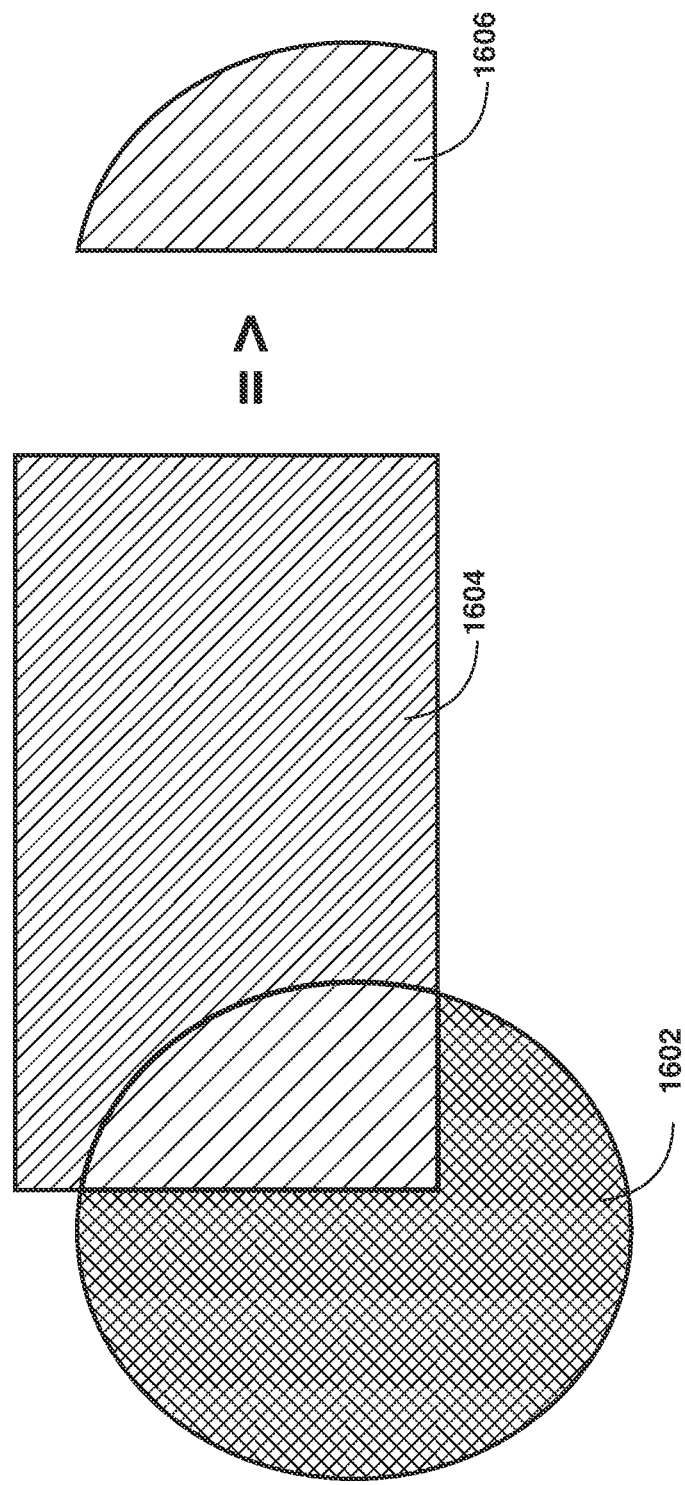
FIG. 16 is a two-dimensional representation of a Boolean operation on two probes.

Still another useful technique is to combine probes, which can be done in various ways. For example, a Boolean operation such as intersection, union or complement, may be used to combine multiple probes to create one new combined probe. FIG. 16 is a two-dimensional representation of a first probe 1602 and a second probe 1604 defined according to the techniques described herein. The Boolean operation of union combines the two probes to make a single probe. The Boolean operation intersection defines a new, combined probe only where the two probes intersect. This is shown in FIG. 16 with combined probe 1606.

Figure 17:
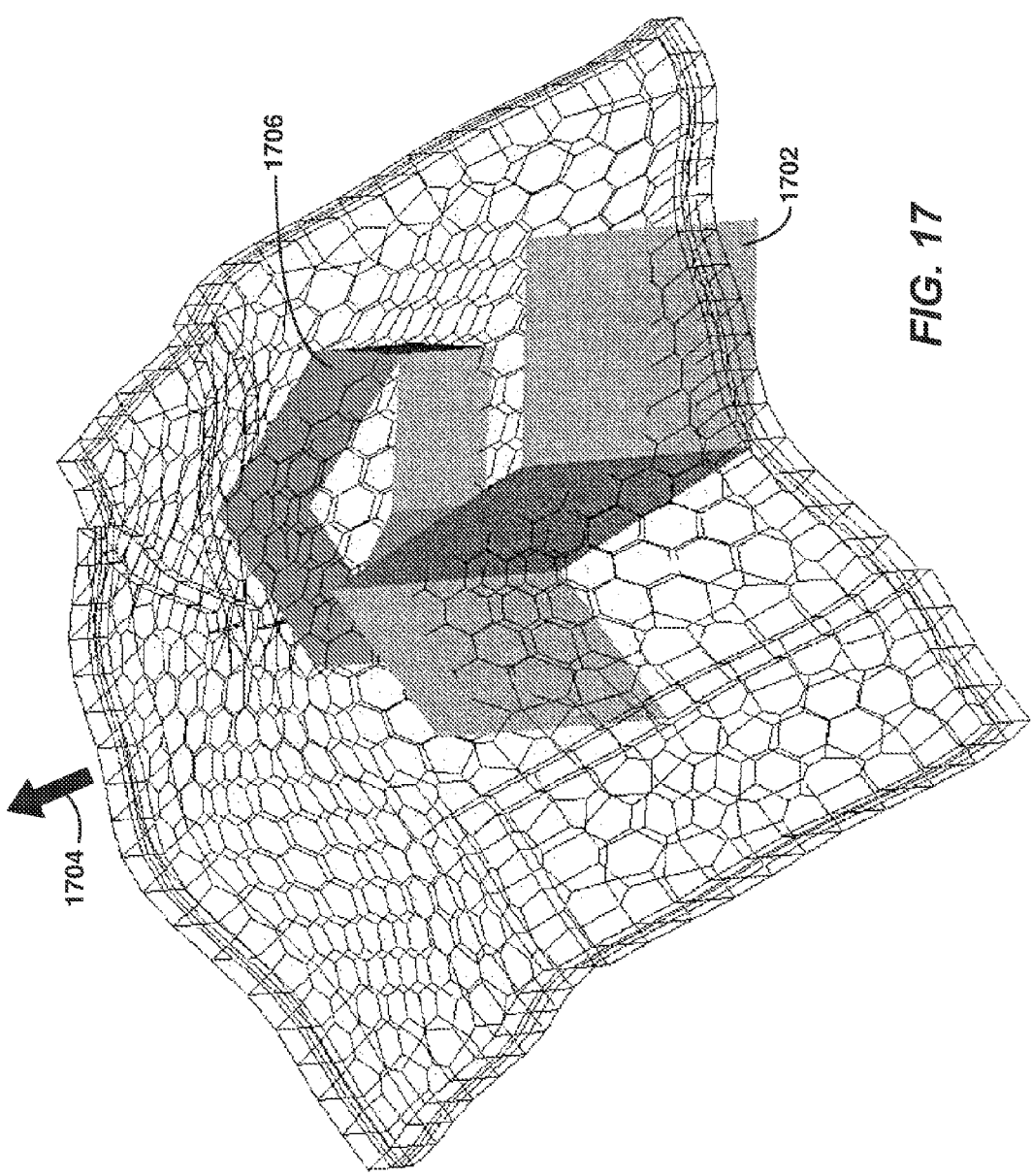
FIG. 17 is a perspective view of an unstructured grid and two probes.
Figure 18:
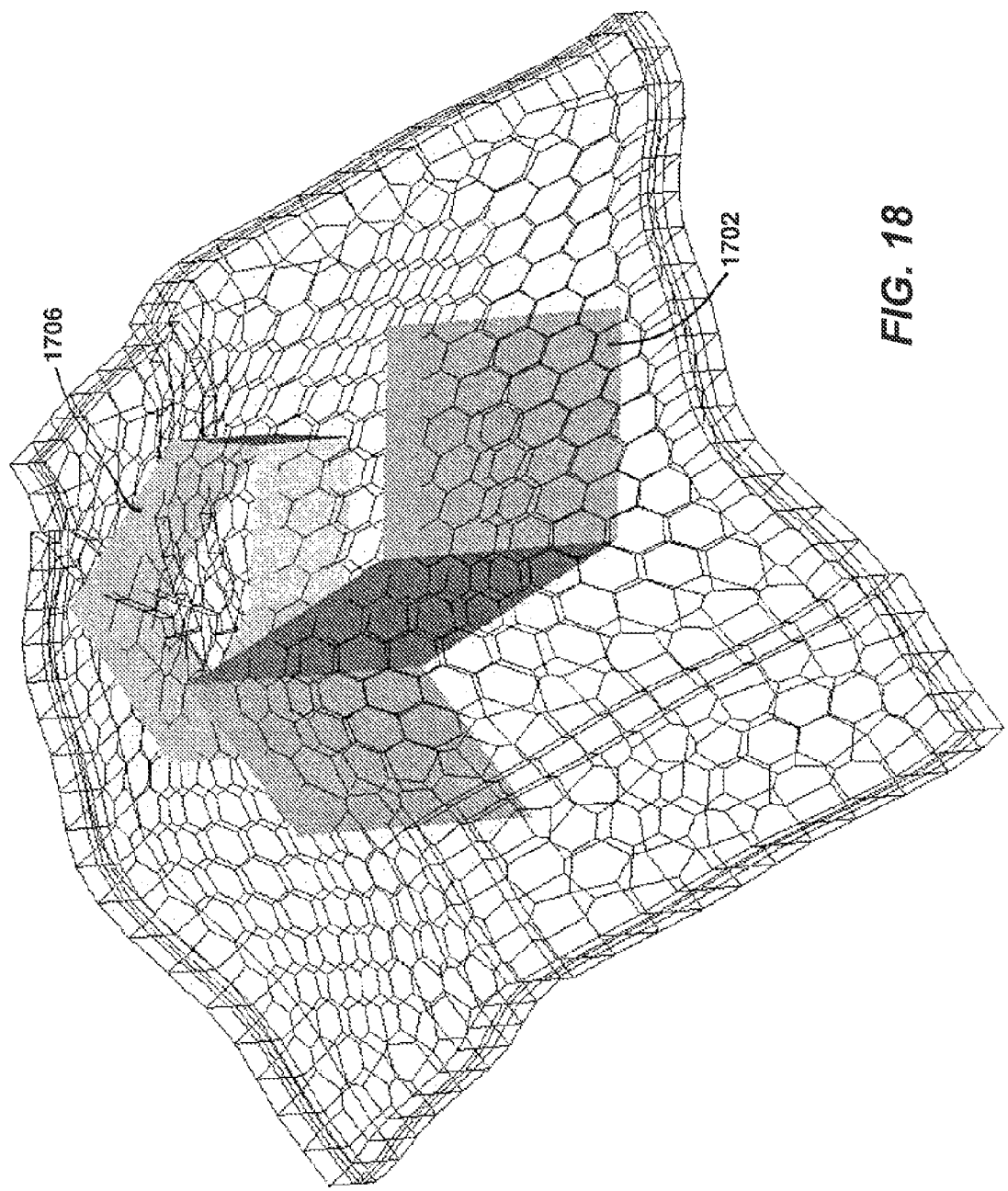
FIG. 18 is a perspective view of the unstructured grid and two probes of FIG. 17.

Yet another useful technique is to link probes together such that geometric changes to one probe, such as translation, rotation or editing, are reflected in the other linked probes. As shown in FIG. 17, a translation of a first probe 1702 in the direction shown by arrow 1704 moves second probe 1706 in the same direction, as shown in the new positions of the first and second probes 1702, 1706 in FIG. 18.

As shown in FIG. 6, a VE according to exemplary embodiments of the present techniques provides a visualization of cell data for cells that interact with the probe region 606. Moreover, the visualization of the unstructured grid data is displayed on the geometry defined by the probe. The visualization may include a representation of data corresponding to the property of interest. For example, data corresponding to the cells within the probe region 606 may be shown in different colors on the geometry defined by the probe to indicate different values of the property of interest.

To create a visualization by selecting a probe region or volume of interest, a three-dimensional structure such as a sphere or a polyhedron is created in such a way that it at least partially intersects an unstructured grid. The three-dimensional structure represents a probe region. The probe region may be chosen based on any criteria that a user may wish to employ. In particular, the user may select an area for the probe region for which a visualization of data corresponding to the property of interest is desired.

A property of the unstructured grid may then be rendered on the faces of the three-dimensional structure of the probe region. For example, a value or color corresponding to each cell in the probe region may be displayed as a portion of the visualization. Alternatively, an unstructured grid property may be volume rendered on the interior of the three-dimensional structure of the probe region. As yet another alternative, a structured grid may be created within the three-dimensional volume of interest. A property of the unstructured grid may be sampled and used to volume render the structured grid. After the application of any of these alternative techniques, the three-dimensional volume of interest may be moved and the associated grid property re-rendered.

Figure 19:
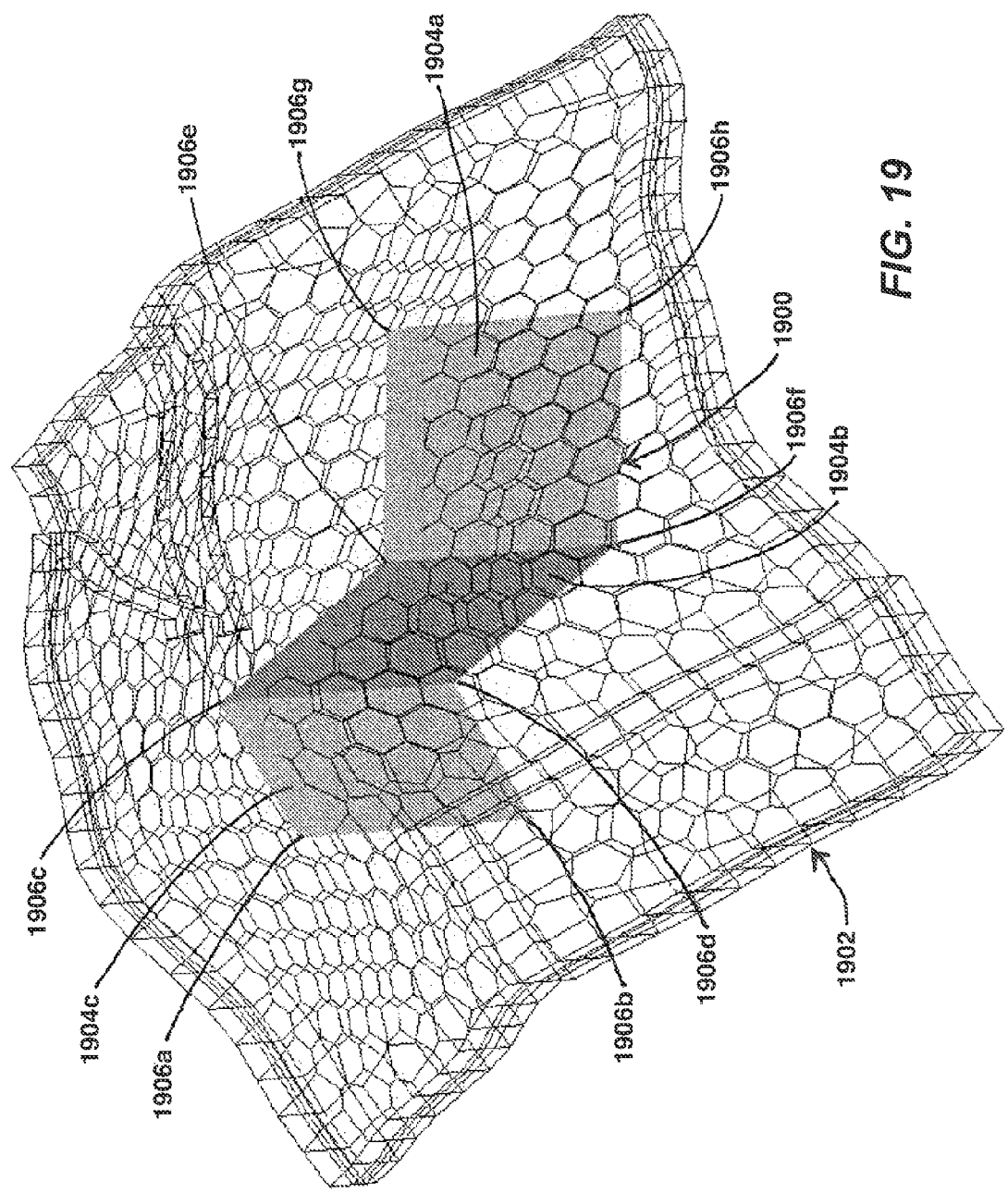
FIG. 19 is a perspective view of an unstructured grid and a probe.

In addition, one or more vertices of the probe may be moved, deleted or added. The corresponding property may then be re-rendered on the geometry of the probe. As an example, FIG. 19 depicts a probe 1900 in an unstructured grid 1902. Probe 1900 is composed of several vertical sections 1904*a*, 1904*b*, 1904*c* defined by vertices such as vertices 1906*a*, 1906*b*, 1906*c*, 1906*d*, 1906*e*, 1906*f*, 1906*g*, and 1906*h*. FIG. 20 shows probe 1900 after vertices 1906*a*, 1906*b*, 1906*e*, and 1906*f* have been moved to different positions relative to the unstructured grid, while vertices 1906*c*, 1906*d*, 1906*g*, and 1906*h* remain unchanged. Thus, as opposed to moving the entire probe, the shape of the probe can be modified by adding to, deleting from, or modifying portions of the existing probe geometry.

Another example of changes to the probe is when the probe and/or the geometric definition of the probe changes as a function of time. Further, the unstructured grid and/or the unstructured grid data which is visualized on the probe may also change over time. Any and all of these time-based changes may be accounted for and visualized using the aspects and techniques disclosed herein and/or U.S. application Ser. No. 12/791,609, filed Jun. 1, 2010, titled "System and Method for Providing a Time-Based Representation of Data" with inventors Timothy A. Chartrand et al., the disclosure of which is incorporated by reference herein in its entirety for all purposes.

A region within a probe may be volume rendered as a structured grid. For the case of structured grid volume rendering, a box probe on an unstructured grid may be volume rendered by replacing a six-sided probe with a structured grid and sampling onto that grid for volume rendering of the probe. The user would be able to tune the granularity of the sampling relative to the interactive requirements to achieve a balance between interaction and image quality.

Figure 7:
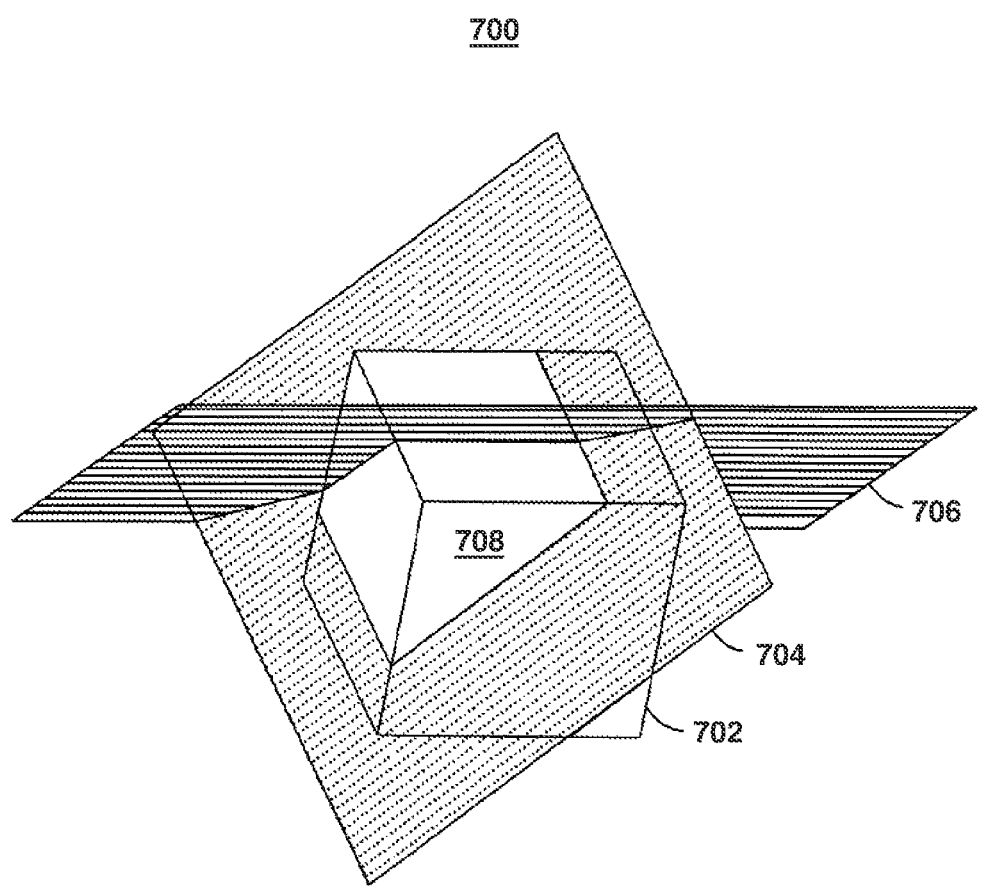
FIG. 7 is a 3D graph showing the use of cross-sections to describe a probe region in an unstructured grid according to an exemplary embodiment of the present techniques.

FIG. 7 is a 3D graph showing the use of cross-sections to describe a probe region in an unstructured grid according to an exemplary embodiment of the present techniques. The graph is generally referred to by the reference number 700. The graph 700 is useful in explaining the definition of a 3D probe region using cross-sections.

The graph 700 comprises an unstructured grid 702. For purposes of simplicity, no constituent cells of the unstructured grid 702 are shown in FIG. 7. The unstructured grid 702 is intersected by a first cross-sectional plane 704 and a second cross-sectional plane 706. As set forth above, the first cross-sectional plane 704 and a second cross-sectional plane 706 may be chosen by the user based on a wide range of considerations. Moreover, the selection of the probe region and subsequent definition thereof are performed by a user based on one or more properties of the 3D space represented by the unstructured grid that may be of interest to the user. An exemplary embodiment of the present techniques employs a probe that comprises an object defined by a set of topological elements, at least one of which does not share a common plane.

The first cross-sectional plane 704 and the second cross-sectional plane 706 define a 3D polyhedronal probe region 708. Exemplary embodiments of the present techniques may comprise a VE that is adapted to render a visualization of data corresponding to a property of interest on the surfaces of the 3D polyhedronal probe region 708. In addition, other techniques may be employed to provide a useful visualization using the 3D polyhedronal probe region 708. For example, the interior of the 3D polyhedronal probe region 708 may be represented as a structured grid, which may be volume rendered.

Figure 8:
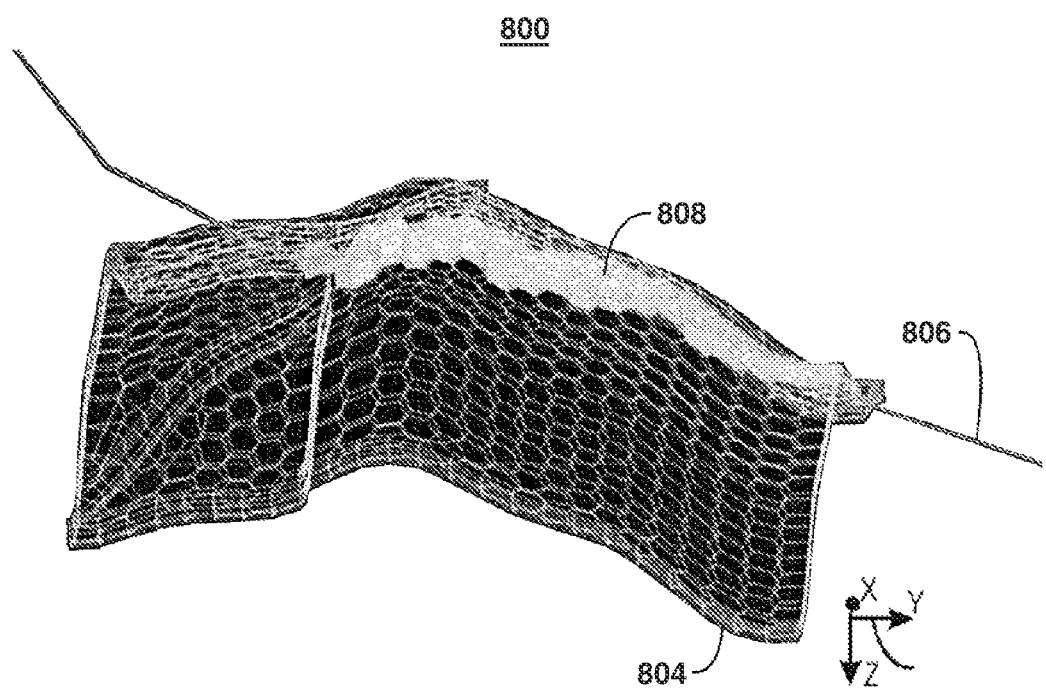
FIG. 8 is a 3D graph showing a filtered visual representation in an unstructured grid according to an exemplary embodiment of the present techniques.

FIG. 8 is a 3D graph showing a filtered visual representation in an unstructured grid according to an exemplary embodiment of the present techniques. The graph is generally referred to by the reference number 800. A legend 802 shows a directional reference for an x-axis, a y-axis and a z-axis.

The graph 800 shows an unstructured grid 804, which may correspond to a portion of a 3D space. The unstructured grid 804 represents a plurality of cells, each of which embodies data about a property of interest for the 3D space. Moreover, the cells are defined because they represent a region of the 3D space having a common value (or range of values) for the property of interest. As described herein, a filtering technique according to the present techniques allows a user to define a filter object corresponding to an item of interest such as a well path. The definition of the filter object is not based on cells in a grid corresponding to a physical property model. The filter object provides data from the grid cells for cells that are intersected by the filter object.

According to an exemplary embodiment of the present techniques, no visualization of the property of interest is shown for most of the unstructured grid 804. However, a visualization of cell data may be provided based on one or more filter criterion selected by a user. By way of example, the graph 800 includes a well path 806, which is an example of a fixed object in the 3D region. A user may be interested in viewing a visualization of data corresponding to the property of interest for cells that meet a specific filter criterion. As shown in FIG. 8, the graph 800 includes a filter region 808, which includes cells that are within a specific user-selected filter distance of the well path 806.

A visualization of the filter region 808 shows the cell values for the property of interest for the cells that meet the filter criterion. For example, the cells within the filter region 808 may be represented by corresponding data values or may be shown in different colors to indicate different values of the property of interest.

In general, a visualization may be created using filtering by selecting a range of a cell geometry or one or more cell property values. Cells that meet the filtering criteria are selected. This process may be repeated as desired for any number of filters.

If multiple filters are used, the different filters may be combined using Boolean operations such as UNION, SUBTRACT, NEGATE, INTERSECTION or the like. Cells may then be selected based on the result of the chosen Boolean operation(s). A visualization of the selected cells may then be created.

Examples of filters that may be created by Boolean operations include, without limitation, property thresholds, distances from other objects, surface or line intersections, i,j,k topological identification, user defined regions or the like. These filters may operate on a point (vertex) topology, a face topology, and/or a cell topology to filter down to only the topological elements that meet the criteria. The resulting subset of the model geometry is then provided for display.

Figure 9:
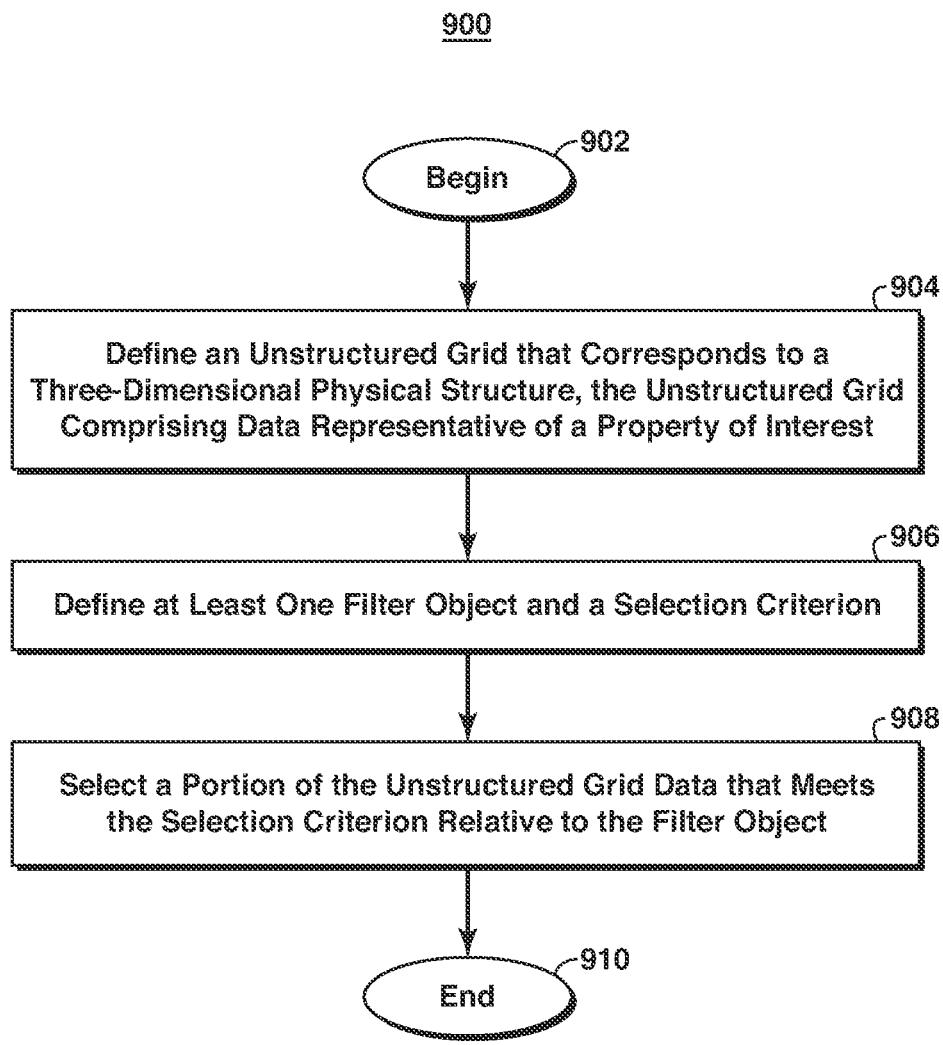
FIG. 9 is a process flow diagram showing a method for providing visualizations of data that represents a physical object according to exemplary embodiments of the present techniques.

FIG. 9 is a process flow diagram showing a method for providing visualizations of data that represents a physical object according to exemplary embodiments of the present techniques. The process is generally referred to by the reference number 900. The process 900 may be executed using one or more computer components of the type described below with reference to FIG. 11. Such computer components may comprise one or more tangible, machine-readable media that stores computer-executable instructions. The process 900 begins at block 902.

At block 904, an unstructured grid that corresponds to a three-dimensional physical structure is defined. The unstructured grid may comprise data representative of a property of interest in the three-dimensional physical structure.

At block 906, a probe comprising an object that comprises a set of topological elements is defined. According to an exemplary embodiment of the present techniques, at least one of the topological elements does not share a common plane with the remainder of the set of topological elements. At block 908, a visual representation of the unstructured grid data is provided on the geometry defined by the probe. The process ends at block 910.

Figure 10:
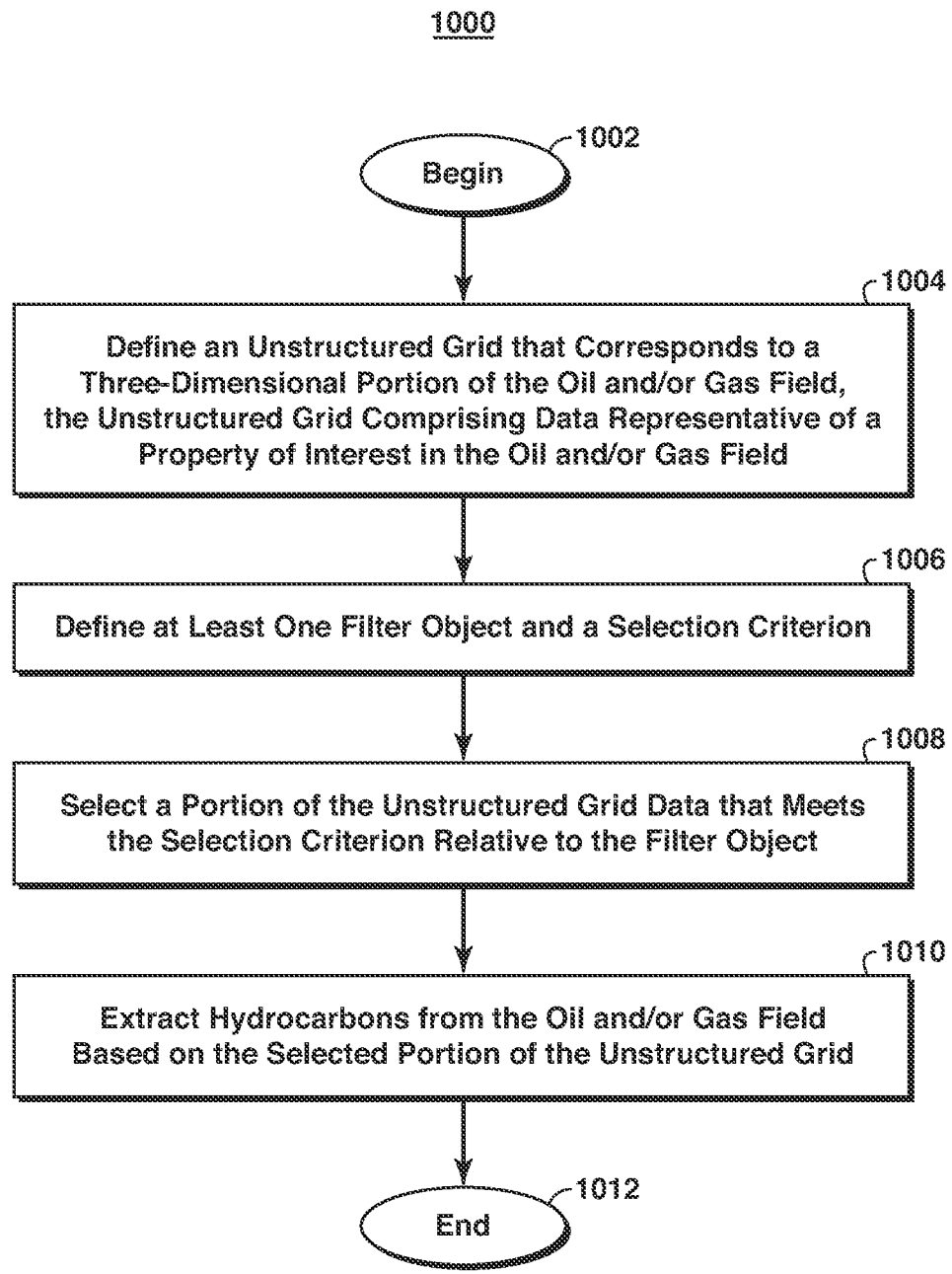
FIG. 10 is a process flow diagram showing a method for producing hydrocarbons from a subsurface region such as an oil and/or gas field according to exemplary embodiments of the present techniques.

FIG. 10 is a process flow diagram showing a method for producing hydrocarbons from an oil and/or gas field using a visualization of data describing a physical structure according to exemplary embodiments of the present techniques. The process is generally referred to by the reference number 1000. Those of ordinary skill in the art will appreciate that the present techniques may facilitate the production of hydrocarbons by producing visualizations that allow geologists, engineers and the like to determine a course of action to take to enhance hydrocarbon production from a subsurface region. By way of example, a visualization produced according to an exemplary embodiment of the present techniques may allow an engineer or geologist to determine a well placement to increase production of hydrocarbons from a subsurface region. At block 1002, the process begins.

At block 1004, an unstructured grid that corresponds to a three-dimensional physical structure of the oil and/or gas field is defined. The unstructured grid may comprise a plurality of cells that embody data representative of a property of interest in the oil and/or gas field.

At block 1006, a probe comprising an object that comprises a set of topological elements is defined. As described herein, at least one of the topological elements does not share a common plane with the remainder of the set of topological elements. At block 1008, a visual representation of the unstructured grid data is produced on the geometry defined by the probe. Hydrocarbons are extracted from the oil and/or gas field based on the visualization, as shown at block 1010. At block 1012, the process ends.

Figure 11:
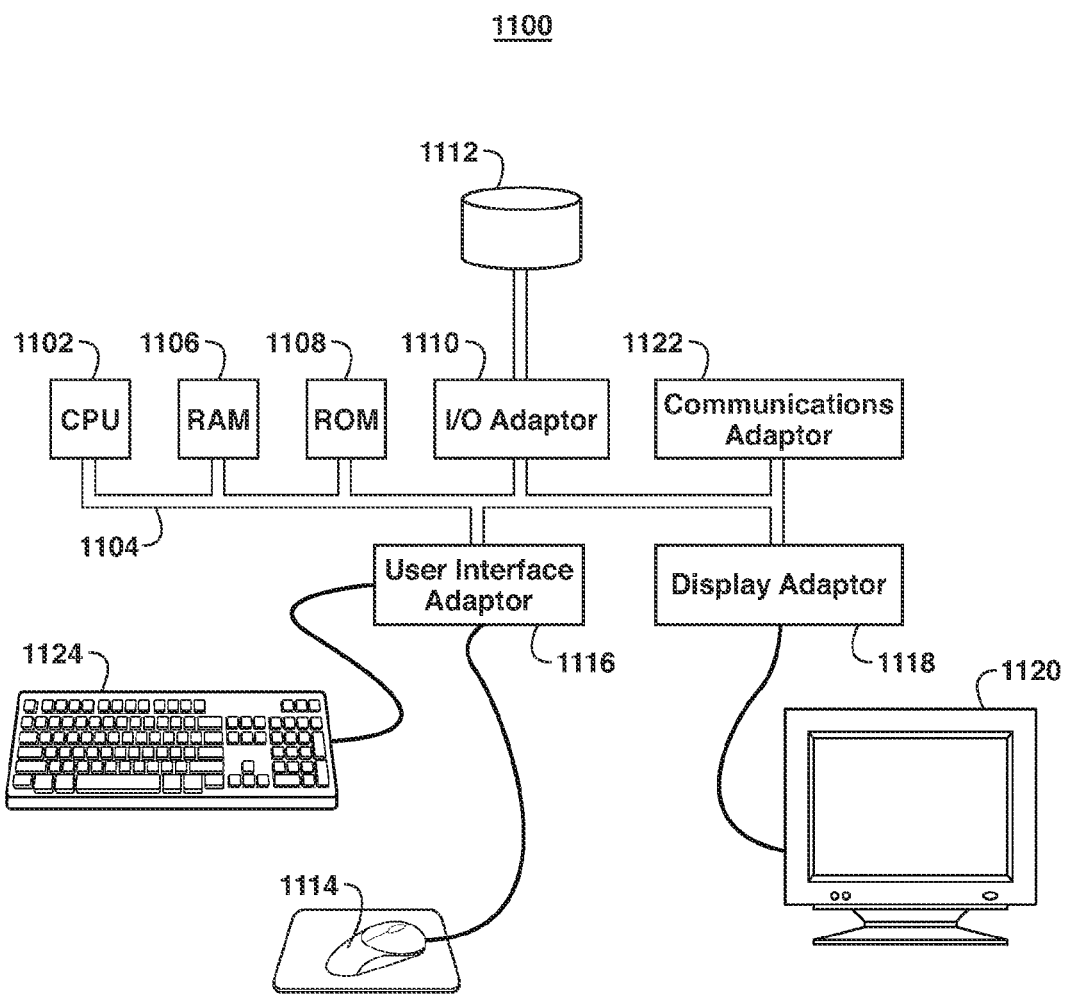
FIG. 11 is a block diagram of a computer network that may be used to perform a method for providing visualizations of data that represents a physical object according to exemplary embodiments of the present techniques.

FIG. 11 is a block diagram of a computer network that may be used to perform a method for providing visualizations of data that represents a physical object according to exemplary embodiments of the present techniques. A central processing unit (CPU) 1101 is coupled to system bus 1102. The CPU 1101 may be any general-purpose CPU, although other types of architectures of CPU 1101 (or other components of exemplary system 1100) may be used as long as CPU 1101 (and other components of system 1100) supports the inventive operations as described herein. The CPU 1101 may execute the various logical instructions according to various exemplary embodiments. For example, the CPU 1101 may execute machine-level instructions for performing processing according to the operational flow described above in conjunction with FIG. 9 or FIG. 10.

The computer system 1100 may also include computer components such as a random access memory (RAM) 1103, which may be SRAM, DRAM, SDRAM, or the like. The computer system 1100 may also include read-only memory (ROM) 1104, which may be PROM, EPROM, EEPROM, or the like. RAM 1103 and ROM 1104 hold user and system data and programs, as is known in the art. The computer system 1100 may also include an input/output (I/O) adapter 1105, a communications adapter 1111, a user interface adapter 1108, and a display adapter 1109. The I/O adapter 1105, the user interface adapter 1108, and/or communications adapter 1111 may, in certain embodiments, enable a user to interact with computer system 1100 in order to input information.

The I/O adapter 1105 preferably connects a storage device(s) 1106, such as one or more of hard drive, compact disc (CD) drive, floppy disk drive, tape drive, etc. to computer system 1100. The storage device(s) may be used when RAM 1103 is insufficient for the memory requirements associated with storing data for operations of embodiments of the present techniques. The data storage of the computer system 1100 may be used for storing information and/or other data used or generated as disclosed herein. The communications adapter 1111 may couple the computer system 1100 to a network 1112, which may enable information to be input to and/or output from system 1100 via the network 1112 (for example, the Internet or other wide-area network, a local-area network, a public or private switched telephony network, a wireless network, any combination of the foregoing). User interface adapter 1108 couples user input devices, such as a keyboard 1113, a pointing device 1107, and a microphone 1114 and/or output devices, such as a speaker(s) 1115 to the computer system 1100. The display adapter 1109 is driven by the CPU 1101 to control the display on a display device 1110 to, for example, display information or a representation pertaining to a portion of a subsurface region under analysis, such as displaying data corresponding to a physical property of interest, according to certain exemplary embodiments.

The architecture of system 1100 may be varied as desired. For example, any suitable processor-based device may be used, including without limitation personal computers, laptop computers, computer workstations, and multi-processor servers. Moreover, embodiments may be implemented on application specific integrated circuits (ASICs) or very large scale integrated (VLSI) circuits. In fact, persons of ordinary skill in the art may use any number of suitable structures capable of executing logical operations according to the embodiments.

The present techniques may be susceptible to various modifications and alternative forms, and the exemplary embodiments discussed above have been shown only by way of example. However, the present techniques are not intended to be limited to the particular embodiments disclosed herein. Indeed, the present techniques include all alternatives, modifications, and equivalents falling within the spirit and scope of the appended claims.

What is claimed is:

1. A computer implemented method for providing a visualization of data describing a physical structure, the method comprising:
    defining an unstructured grid that corresponds to a three-dimensional physical structure, the unstructured grid comprising data representative of a property of interest and the unstructured grid being a completely unstructured grid that does not employ an index domain to define the unstructured grid;
    defining a probe as an object that comprises a set of topological elements, at least one of which does not share a common plane, wherein the probe is defined by defining the probe includes identifying a geologic object and executing a geometric operation relative to the separate geologic object, that generates the probe a predetermined distance away from the geologic object; and
    using a computer to provide a visualization of the unstructured grid data on a geometry defined by the probe.

2. The method recited in claim 1, wherein the probe comprises a closed three-dimensional surface.

3. The method recited in claim 1, comprising producing a volume rendering within a closed space defined by the probe.

4. The method recited in claim 1, comprising producing a volume rendering within a space defined by a distance and/or a direction from the probe.

5. The method recited in claim 1, comprising:
    defining a structured grid within a space defined by the probe; and
    producing a volume rendering within the structured grid.

6. The method recited in claim 1, comprising:
    moving the probe to a different location; and
    providing a visualization of the unstructured grid on the geometry defined by the probe.

7. The method recited in claim 1, wherein the predetermined distance is a directionless distance.

8. The method recited in claim 1, wherein the predetermined distance is a vector distance.

9. The method recited in claim 1, further comprising: defining an offset distance from a separate the geologic object; and defining the probe using a vector distance from the offset.

10. The method recited in claim 1, further comprising:
modifying the definition of the probe such that the probe has a changed geometry; and
providing a visualization of the unstructured grid on the probe with the changed geometry.

11. The method recited in claim 10, wherein modifying the definition of the probe comprises changing a location of less than all vertices defining the probe.

12. The method recited in claim 10, wherein modifying the definition of the probe comprises adding or deleting vertices to the probe.

13. The method recited in claim 1, further comprising:
accounting for time-based changes to at least one of the probe, a geometry of the probe, a geometry of the unstructured grid, and the data; and
providing a visualization of the time-based changes.

14. A computer system that is adapted to provide a visualization of data describing a physical structure, the computer system comprising:
a processor; and
a tangible, machine-readable storage medium that stores machine-readable instructions for execution by the processor, the machine-readable instructions comprising:
code that, when executed by the processor, is adapted to cause the processor to define an unstructured grid that corresponds to a three-dimensional physical structure, the unstructured grid comprising data representative of a property of interest and the unstructured grid being a completely unstructured grid that does not employ an index domain to define the unstructured grid;
code that, when executed by the processor, is adapted to cause the processor to define a probe as an object that comprises a set of topological elements, at least one of which does not share a common plane, wherein the probe is defined by defining the probe includes identifying a geologic object and executing a geometric operation, relative to the separate geologic object, that generates the probe a predetermined distance away from the geologic object; and
code that, when executed by the processor, is adapted to cause the processor to provide a visualization of the unstructured grid data on a geometry defined by the probe.

15. The computer system recited in claim 14, wherein the probe comprises a closed three-dimensional surface.

16. The computer system recited in claim 14, comprising code that, when executed by the processor, is adapted to cause the processor to produce a volume rendering within a closed space defined by the probe.

17. The computer system recited in claim 14, comprising code that, when executed by the processor, is adapted to cause the processor to produce a volume rendering within a space defined by a distance and/or a direction from the probe.

18. The computer system recited in claim 14, comprising:
code that, when executed by the processor, is adapted to cause the processor to define a structured grid within a space defined by the probe; and
code that, when executed by the processor, is adapted to cause the processor to produce a volume rendering within the structured grid.

19. The computer system recited in claim 14, comprising:
code that, when executed by the processor, is adapted to cause the processor to move the probe to a different location; and
code that, when executed by the processor, is adapted to cause the processor to provide a visualization of the unstructured grid on the geometry defined by the probe.

20. A method for producing hydrocarbons from an oil and/or gas field using a visualization of data describing a physical structure, the method comprising:
defining an unstructured grid that corresponds to a three-dimensional physical structure of the oil and/or gas field, the unstructured grid comprising data representative of a property of interest in the oil and/or gas field and the unstructured grid being a completely unstructured grid that does not employ an index domain to define the unstructured grid;
defining a probe as an object that comprises a set of topological elements, at least one of which does not share a common plane, wherein the probe is defined by defining the probe includes identifying a geologic object and executing a geometric operation, relative to the separate geologic object, that generates the probe a predetermined distance away from the geologic object;
using a computer to provide a visualization of the unstructured grid data on the geometry defined by the probe; and
extracting hydrocarbons from the oil and/or gas field based on the visualization.

21. The method recited in claim 20, wherein the probe comprises a closed three-dimensional surface.

22. The method recited in claim 20, comprising producing a volume rendering within a closed space defined by the probe.

23. A method for providing a visualization of data describing a physical structure, the method comprising:
defining an unstructured grid that corresponds to a three-dimensional physical structure, the unstructured grid comprising data representative of a property of interest and the unstructured grid being a completely unstructured grid that does not employ an index domain to define the unstructured grid;
defining a first probe as an object that comprises a set of topological elements, at least one of which does not share a common plane;
defining a second probe as an object that comprises a set of topological elements, at least one of which does not share a common plane;
linking the first probe and the second probe such that movement of one of the probes is reflected by movement of the other of the probes; and
using a computer to provide a visualization of the unstructured grid data on the geometry defined by the first probe and the second probe.

24. The method recited in claim 23 further comprising:
defining a combined probe as an object that is a product of a Boolean operation on the first probe and the second probe.

25. The method recited in claim 23, further comprising:
modifying the definition of the first or second probe such that the first or second probe has a changed geometry; and
providing a visualization of the unstructured grid on the first or second probe with the changed geometry.

26. The method recited in claim 25, wherein modifying the definition of the first or second probe comprises changing a location of less than all vertices defining the first or second probe.

27. The method recited in claim 25, wherein modifying the definition of the first or second probe comprises adding or deleting vertices to the first or second probe.

28. The method recited in claim 23, further comprising:
accounting for time-based changes to at least one of the first or second probe, a geometry of the first or second probe, a geometry of the unstructured grid, and the data; and
providing a visualization of the time-based changes.

* * * * *